US 9,754,824 B2
Sep. 5, 2017

(54) TUNGSTEN FILMS HAVING LOW FLUORINE CONTENT

(71) Applicant: Lam Research Corporation, Fremont, CA (US)

(72) Inventors: Lawrence Schloss, Palo Alto, CA (US); Xiaolan Ba, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/723,275

(22) Filed: May 27, 2015

(65) Prior Publication Data

US 2016/0351444 A1    Dec. 1, 2016

(51) Int. Cl.
 *H01L 21/44* (2006.01)
 *H01L 21/768* (2006.01)
 (Continued)

(52) U.S. Cl.
 CPC .... *H01L 21/76876* (2013.01); *C23C 16/0281* (2013.01); *C23C 16/045* (2013.01); *C23C 16/14* (2013.01); *C23C 16/45525* (2013.01); *H01L 21/28562* (2013.01); *H01L 21/76877* (2013.01); *H01L 21/76898* (2013.01)

(58) Field of Classification Search
 CPC ... C23C 16/08; C23C 16/14; C23C 16/45525; H01L 21/02697; H01L 21/76841; H01L 21/76871
 See application file for complete search history.

(56) References Cited

U.S. PATENT DOCUMENTS

| 4,746,375 A | 5/1988 | Iacovangelo |
| 4,804,560 A | 2/1989 | Shioya et al. |

(Continued)

FOREIGN PATENT DOCUMENTS

| CN | 101899649 A | 12/2010 |
| CN | 103125013 A | 5/2013 |

(Continued)

OTHER PUBLICATIONS

U.S. Appl. No. 15/040,561, filed Feb. 10, 2016, entitled "Tungsten for Wordline Applications.".

(Continued)

*Primary Examiner* — Selim Ahmed
*Assistant Examiner* — Evan Clinton
(74) *Attorney, Agent, or Firm* — Weaver Austin Villeneuve & Sampson LLP

(57) ABSTRACT

Aspects of the methods and apparatus described herein relate to deposition of tungsten nucleation layers and other tungsten-containing films. Various embodiments of the methods involve exposing a substrate to alternating pulses of a tungsten precursor and a reducing agent at low chamber pressure to thereby deposit a tungsten-containing layer on the surface of the substrate. According to various embodiments, chamber pressure may be maintained at or below 10 Torr. In some embodiments, chamber pressure may be maintained at or below 7 Torr, or even lower, such as at or below 5 Torr. The methods may be implemented with a fluorine-containing tungsten precursor, but result in very low or undetectable amounts of fluorine in the deposited layer.

20 Claims, 12 Drawing Sheets

(51) Int. Cl.
*H01L 21/285* (2006.01)
*C23C 16/02* (2006.01)
*C23C 16/04* (2006.01)
*C23C 16/14* (2006.01)
*C23C 16/455* (2006.01)

(56) References Cited

U.S. PATENT DOCUMENTS

| | | | |
|---|---|---|---|
| 4,874,719 A | 10/1989 | Kurosawa | |
| 4,962,063 A | 10/1990 | Maydan et al. | |
| 5,028,565 A | 7/1991 | Chang et al. | |
| 5,227,329 A | 7/1993 | Kobayashi et al. | |
| 5,250,329 A | 10/1993 | Miracky et al. | |
| 5,250,467 A | 10/1993 | Somekh et al. | |
| 5,308,655 A | 5/1994 | Eichman et al. | |
| 5,326,723 A | 7/1994 | Petro et al. | |
| 5,370,739 A | 12/1994 | Foster et al. | |
| 5,391,394 A | 2/1995 | Hansen | |
| 5,407,698 A | 4/1995 | Emesh | |
| 5,567,583 A | 10/1996 | Wang et al. | |
| 5,633,200 A | 5/1997 | Hu | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,833,817 A | 11/1998 | Tsai et al. | |
| 5,913,145 A | 6/1999 | Lu et al. | |
| 5,916,365 A | 6/1999 | Sherman | |
| 5,916,634 A | 6/1999 | Fleming et al. | |
| 5,926,720 A | 7/1999 | Zhao et al. | |
| 5,956,609 A | 9/1999 | Lee et al. | |
| 5,963,833 A | 10/1999 | Thakur | |
| 5,994,749 A | 11/1999 | Oda | |
| 6,001,729 A | 12/1999 | Shinriki et al. | |
| 6,013,575 A | 1/2000 | Itoh | |
| 6,017,818 A | 1/2000 | Lu | |
| 6,034,419 A | 3/2000 | Nicholls et al. | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,260,266 B1 | 7/2001 | Tamaki | |
| 6,265,312 B1 | 7/2001 | Sidhwa et al. | |
| 6,277,744 B1 | 8/2001 | Yuan et al. | |
| 6,284,316 B1 | 9/2001 | Sandhu et al. | |
| 6,287,965 B1 | 9/2001 | Kang et al. | |
| 6,294,468 B1 | 9/2001 | Gould-Choquette et al. | |
| 6,297,152 B1 | 10/2001 | Itoh et al. | |
| 6,306,211 B1 | 10/2001 | Takahashi et al. | |
| 6,309,964 B1 | 10/2001 | Tsai et al. | |
| 6,309,966 B1 | 10/2001 | Govindarajan et al. | |
| 6,310,300 B1 | 10/2001 | Cooney et al. | |
| 6,340,629 B1 | 1/2002 | Yeo et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,491,978 B1 | 12/2002 | Kalyanam | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,581,258 B2 | 6/2003 | Yoneda et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,777,331 B2 | 8/2004 | Nguyen | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,903,016 B2 | 6/2005 | Cohen | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,235,486 B2 | 6/2007 | Kori et al. | |
| 7,262,125 B2 | 8/2007 | Wongsenakhum et al. | |
| 7,338,900 B2 | 3/2008 | Mizuno et al. | |
| 7,355,254 B2 | 4/2008 | Datta et al. | |
| 7,416,979 B2 | 8/2008 | Yoon et al. | |
| 7,419,904 B2 | 9/2008 | Kato | |
| 7,429,402 B2 | 9/2008 | Gandikota et al. | |
| 7,465,665 B2 | 12/2008 | Xi et al. | |
| 7,465,666 B2 | 12/2008 | Kori et al. | |
| 7,501,343 B2 | 3/2009 | Byun et al. | |
| 7,501,344 B2 | 3/2009 | Byun et al. | |
| 7,563,718 B2 | 7/2009 | Kim | |
| 7,589,017 B2 | 9/2009 | Chan et al. | |
| 7,595,263 B2 | 9/2009 | Chung et al. | |
| 7,605,083 B2 | 10/2009 | Lai et al. | |
| 7,611,990 B2 | 11/2009 | Yoon et al. | |
| 7,655,567 B1 | 2/2010 | Gao et al. | |
| 7,674,715 B2 | 3/2010 | Kori et al. | |
| 7,675,119 B2 | 3/2010 | Taguwa | |
| 7,691,749 B2 | 4/2010 | Levy et al. | |
| 7,695,563 B2 | 4/2010 | Lu et al. | |
| 7,709,385 B2 | 5/2010 | Xi et al. | |
| 7,732,327 B2 | 6/2010 | Lee et al. | |
| 7,745,329 B2 | 6/2010 | Wang et al. | |
| 7,745,333 B2 | 6/2010 | Lai et al. | |
| 7,749,815 B2 | 7/2010 | Byun | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,964,505 B2 | 6/2011 | Khandelwal et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,071,478 B2 | 12/2011 | Wu et al. | |
| 8,087,966 B2 | 1/2012 | Hebbinghaus et al. | |
| 8,101,521 B1 | 1/2012 | Gao et al. | |
| 8,110,877 B2 | 2/2012 | Mukherjee et al. | |
| 8,119,527 B1 | 2/2012 | Chandrashekar et al. | |
| 8,207,062 B2 | 6/2012 | Gao et al. | |
| 8,258,057 B2 | 9/2012 | Kuhn et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 8,551,885 B2 | 10/2013 | Chen et al. | |
| 8,623,733 B2 | 1/2014 | Chen et al. | |
| 8,709,948 B2 | 4/2014 | Danek et al. | |
| 8,853,080 B2 | 10/2014 | Guan et al. | |
| 8,975,184 B2 | 3/2015 | Chen et al. | |
| 8,993,055 B2 | 3/2015 | Rahtu et al. | |
| 9,034,760 B2 | 5/2015 | Chen et al. | |
| 9,076,843 B2 | 7/2015 | Lee et al. | |
| 9,153,486 B2 | 10/2015 | Arghavani et al. | |
| 9,159,571 B2 | 10/2015 | Humayun et al. | |
| 9,236,297 B2 | 1/2016 | Chen et al. | |
| 9,240,347 B2 | 1/2016 | Chandrashekar et al. | |
| 9,583,385 B2 | 2/2017 | Lee et al. | |
| 9,589,808 B2 | 3/2017 | Bamnolker et al. | |
| 9,613,818 B2 | 4/2017 | Ba et al. | |
| 2001/0007797 A1 | 7/2001 | Jang et al. | |
| 2001/0008808 A1 | 7/2001 | Gonzalez | |
| 2001/0014533 A1 | 8/2001 | Sun | |
| 2001/0015494 A1 | 8/2001 | Ahn | |

(56) References Cited

U.S. PATENT DOCUMENTS

| | | |
|---|---|---|
| 2001/0044041 A1 | 11/2001 | Badding et al. |
| 2002/0037630 A1 | 3/2002 | Agarwal et al. |
| 2002/0090796 A1 | 7/2002 | Desai et al. |
| 2002/0090811 A1 | 7/2002 | Kim et al. |
| 2002/0117399 A1 | 8/2002 | Chen et al. |
| 2002/0132472 A1 | 9/2002 | Park |
| 2002/0155722 A1 | 10/2002 | Satta et al. |
| 2002/0168840 A1 | 11/2002 | Hong et al. |
| 2002/0177316 A1 | 11/2002 | Miller et al. |
| 2002/0190379 A1* | 12/2002 | Jian .................... C23C 16/0281 257/751 |
| 2003/0013300 A1* | 1/2003 | Byun .................... C23C 16/0281 438/680 |
| 2003/0059980 A1 | 3/2003 | Chen et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen et al. |
| 2003/0190802 A1 | 10/2003 | Wang et al. |
| 2003/0194850 A1 | 10/2003 | Lewis et al. |
| 2003/0224217 A1 | 12/2003 | Byun et al. |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0151845 A1 | 8/2004 | Nguyen et al. |
| 2004/0202786 A1 | 10/2004 | Wongsenakhum et al. |
| 2004/0206267 A1 | 10/2004 | Sambasivan et al. |
| 2004/0247788 A1 | 12/2004 | Fang et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0179141 A1 | 8/2005 | Yun et al. |
| 2005/0191803 A1 | 9/2005 | Matsuse et al. |
| 2006/0003581 A1 | 1/2006 | Johnston et al. |
| 2006/0075966 A1 | 4/2006 | Chen et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0284317 A1 | 12/2006 | Ito et al. |
| 2007/0087560 A1 | 4/2007 | Kwak et al. |
| 2007/0099420 A1 | 5/2007 | Dominguez et al. |
| 2007/0190780 A1 | 8/2007 | Chung et al. |
| 2008/0045010 A1 | 2/2008 | Wongsenakhum et al. |
| 2008/0081127 A1 | 4/2008 | Thompson et al. |
| 2008/0081452 A1* | 4/2008 | Kim .................... H01L 29/4941 438/592 |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0280438 A1 | 11/2008 | Lai et al. |
| 2008/0283844 A1 | 11/2008 | Hoshi et al. |
| 2009/0045517 A1* | 2/2009 | Sugiura .................... C23C 16/14 257/770 |
| 2009/0050937 A1 | 2/2009 | Murata et al. |
| 2009/0053893 A1 | 2/2009 | Khandelwal et al. |
| 2009/0137117 A1 | 5/2009 | Park et al. |
| 2009/0142509 A1 | 6/2009 | Yamamoto |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0007797 A1 | 1/2010 | Stojancic |
| 2010/0035427 A1 | 2/2010 | Chan et al. |
| 2010/0055904 A1 | 3/2010 | Chen et al. |
| 2010/0062149 A1 | 3/2010 | Ma et al. |
| 2010/0072623 A1 | 3/2010 | Prindle et al. |
| 2010/0130002 A1 | 5/2010 | Dao et al. |
| 2010/0130003 A1 | 5/2010 | Lin et al. |
| 2010/0144140 A1 | 6/2010 | Chandrashekar et al. |
| 2010/0155846 A1 | 6/2010 | Mukherjee et al. |
| 2010/0159694 A1 | 6/2010 | Chandrashekar et al. |
| 2010/0244141 A1 | 9/2010 | Beyer et al. |
| 2010/0244260 A1 | 9/2010 | Hinomura |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0059608 A1 | 3/2011 | Gao et al. |
| 2011/0151670 A1 | 6/2011 | Lee et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0077342 A1 | 3/2012 | Gao et al. |
| 2012/0164832 A1 | 6/2012 | Chandrashekar et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0171822 A1 | 7/2013 | Chandrashekar et al. |
| 2013/0285195 A1 | 10/2013 | Piper |
| 2013/0302980 A1 | 11/2013 | Chandrashekar et al. |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061784 A1* | 3/2014 | Kang .................... H01L 29/4966 257/334 |
| 2014/0061931 A1 | 3/2014 | Kang |
| 2014/0073135 A1 | 3/2014 | Guan et al. |
| 2014/0154883 A1 | 6/2014 | Humayun et al. |
| 2014/0162451 A1 | 6/2014 | Chen et al. |
| 2014/0308812 A1 | 10/2014 | Arghavani et al. |
| 2014/0319614 A1 | 10/2014 | Paul et al. |
| 2015/0037972 A1 | 2/2015 | Danek et al. |
| 2015/0056803 A1 | 2/2015 | Chandrashekar et al. |
| 2015/0179461 A1 | 6/2015 | Bamnolker et al. |
| 2015/0279732 A1 | 10/2015 | Lee et al. |
| 2016/0118345 A1 | 4/2016 | Chen et al. |
| 2016/0190008 A1 | 6/2016 | Chandrashekar et al. |
| 2016/0233220 A1 | 8/2016 | Danek et al. |
| 2016/0351401 A1 | 12/2016 | Ba et al. |
| 2016/0351444 A1 | 12/2016 | Schloss et al. |

FOREIGN PATENT DOCUMENTS

| | | |
|---|---|---|
| EP | 0 437 110 | 7/1991 |
| EP | 1 156 132 | 11/2001 |
| EP | 1 179 838 | 2/2002 |
| JP | S5629648 A | 3/1981 |
| JP | H2-187031 A | 7/1990 |
| JP | H4-142061 A | 5/1992 |
| JP | H5-226280 A | 9/1993 |
| JP | H7-147321 A | 6/1995 |
| JP | H07-226393 | 8/1995 |
| JP | 08-115984 | 5/1996 |
| JP | 09-022896 A | 1/1997 |
| JP | 09-027596 | 1/1997 |
| JP | H10-144688 | 5/1998 |
| JP | H10-163132 | 6/1998 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-016066 A | 1/2002 |
| JP | 2002-124488 | 4/2002 |
| JP | 2003-193233 | 7/2003 |
| JP | 2004-235456 | 8/2004 |
| JP | 2004-273764 | 9/2004 |
| JP | 2005-029821 | 2/2005 |
| JP | 2005-518088 | 6/2005 |
| JP | 2007-009298 | 1/2007 |
| JP | 2007-027627 | 2/2007 |

(56) References Cited

FOREIGN PATENT DOCUMENTS

| | | |
|---|---|---|
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-177577 | 7/2008 |
| JP | 2008-283220 | 11/2008 |
| JP | 2009-024252 | 2/2009 |
| JP | 2009-144242 | 7/2009 |
| JP | 2009-533877 | 9/2009 |
| JP | 2009-540123 | 11/2009 |
| JP | 2010-251760 A | 11/2010 |
| JP | 2011-035366 A | 2/2011 |
| KR | 10-2002-0049730 | 6/2002 |
| KR | 10-2005-0022261 | 3/2005 |
| KR | 10-2005-0087428 | 8/2005 |
| KR | 10-2006-0087844 | 8/2006 |
| KR | 10-2007-705936 | 4/2007 |
| KR | 10-2008-0036679 | 4/2008 |
| KR | 10-2008-0110897 | 12/2008 |
| KR | 10-2009-0103815 | 10/2009 |
| TW | 310461 | 7/1997 |
| TW | 452607 | 9/2001 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/148444 | 10/2013 |
| WO | WO 2013/148880 | 10/2013 |
| WO | WO 2014/058536 | 4/2014 |

OTHER PUBLICATIONS

U.S. Appl. No. 14/723,270, filed May 27, 2015, entitled "Deposition of Low Fluorine Tungsten by Sequential CVD Process.".
U.S. Appl. No. 13/758,928, filed Feb. 4, 2013, entitled "Methods for Forming All Tungsten Contacts and Lines.".
U.S. Appl. No. 14/965,806, filed Dec. 10, 2015, entitled "Tungsten Feature Fill.".
US Office Action, dated Apr. 7, 2014, issued in U.S. Appl. No. 13/633,502.
US Final Office Action, dated Nov. 5, 2014, issued in U.S. Appl. No. 13/633,502.
US Notice of Allowance, dated Mar. 2, 2015, issued in U.S. Appl. No. 13/633,502.
US Notice of Allowance (Supplemental Notice of Allowability), dated Apr. 16, 2015, issued in U.S. Appl. No. 13/633,502.
US Office Action, dated Jan. 12, 2016, issued in U.S. Appl. No. 14/738,685.
US Office Action, dated May 30, 2014, issued in U.S. Appl. No. 13/862,048.
US Final Office Action, dated Oct. 16, 2014, issued in U.S. Appl. No. 13/862,048.
US Notice of Allowance, dated Apr. 28, 2015, issued in U.S. Appl. No. 13/862,048.
US Notice of Allowance, dated Jun. 17, 2015, issued in U.S. Appl. No. 13/862,048.
US Office Action, dated May 6, 2015, issued in U.S. Appl. No. 14/135,375.
US Final Office Action, dated Sep. 29, 2015, issued in U.S. Appl. No. 14/135,375.
US Office Action, dated Jan. 21, 2016, issued in U.S. Appl. No. 14/135,375.
US Office Action, dated Dec. 11, 2014, issued in U.S. Appl. No. 14/173,733.
US Notice of Allowance, dated Jun. 2, 2015, issued in U.S. Appl. No. 14/173,733.
US Office Action, dated Jul. 17, 2002, issued in U.S. Appl. No. 09/975,074.
US Notice of Allowance, dated Mar. 12, 2003, issued in U.S. Appl. No. 09/975,074.
US Office Action, dated Feb. 8, 2005, issued in U.S. Appl. No. 10/649,351.
US Final Office Action, dated Jul. 14, 2005, issued in U.S. Appl. No. 10/649,351.
US Office Action, dated Dec. 30, 2005, issued in U.S. Appl. No. 10/649,351.
US Notice of Allowance, dated Jul. 21, 2006, issued in U.S. Appl. No. 10/649,351.
US Office Action, dated Jun. 22, 2004, issued in U.S. Appl. No. 10/435,010.
US Notice of Allowance, dated Oct. 7, 2004, issued in U.S. Appl. No. 10/435,010.
US Notice of Allowance, dated Jan. 19, 2005, issued in U.S. Appl. No. 10/435,010.
US Office Action, dated Nov. 23, 2005, issued in U.S. Appl. No. 10/984,126.
US Final Office Action, dated May 17, 2006, issued in U.S. Appl. No. 10/984,126.
US Notice of Allowance, dated Aug. 25, 2006, issued in U.S. Appl. No. 10/984,126.
US Office Action, dated Mar. 23, 2005, issued in U.S. Appl. No. 10/690,492.
US Notice of Allowance, dated Sep. 14, 2005, issued in U.S. Appl. No. 10/690,492.
US Office Action, dated Jun. 27, 2008, issued in U.S. Appl. No. 11/305,368.
US Office Action, dated Apr. 3, 2009, issued in U.S. Appl. No. 11/305,368.
US Notice of Allowance, dated Nov. 17, 2009, issued in U.S. Appl. No. 11/305,368.
US Office Action, dated Jul. 12, 2005, issued in U.S. Appl. No. 10/815,560.
US Final Office Action, dated Dec. 28, 2005, issued in U.S. Appl. No. 10/815,560.
US Office Action, dated Apr. 17, 2006, issued in U.S. Appl. No. 10/815,560.
US Office Action, dated Sep. 28, 2006, issued in U.S. Appl. No. 10/815,560.
US Notice of Allowance dated Apr. 24, 2007, issued in U.S. Appl. No. 10/815,560.
US Office Action, dated Aug. 21, 2008, issued in U.S. Appl. No. 11/265,531.
US Final Office Action, dated Feb. 26, 2009, issued in U.S. Appl. No. 11/265,531.
US Notice of Allowance, dated May 4, 2009, issued in U.S. Appl. No. 11/265,531.
US Office Action, dated Nov. 23, 2010, issued in U.S. Appl. No. 12/538,770.
US Notice of Allowance, dated Jun. 30, 2011, issued in U.S. Appl. No. 12/538,770.
US Office Action, dated Oct. 16, 2008, issued in U.S. Appl. No. 11/349,035.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Nov. 20, 2009, issued in U.S. Appl. No. 11/349,035.
US Notice of Allowance, dated Mar. 2, 2010, issued in U.S. Appl. No. 11/349,035.
US Office Action, dated Sep. 29, 2008, issued in U.S. Appl. No. 11/782,570.

(56) References Cited

OTHER PUBLICATIONS

US Final Office Action, dated Apr. 28, 2009, issued in U.S. Appl. No. 11/782,570.
US Notice of Allowance, dated Sep. 17, 2009, issued in U.S. Appl. No. 11/782,570.
US Office Action, dated Jan. 25, 2011, issued in U.S. Appl. No. 12/636,616.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Final Office Action, dated Jan. 13, 2010, issued in U.S. Appl. No. 12/030,645.
US Final Office Action, dated Jul. 23, 2010, issued in U.S. Appl. No. 12/030,645.
US Notice of Allowance and Fee Due, dated Jan. 24, 2011, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.
US Office Action, dated Aug. 5, 2009, issued in U.S. Appl. No. 11/951,236.
US Final Office Action, dated Jan. 26, 2010 from U.S. Appl. No. 11/951,236.
US Notice of Allowance, dated Apr. 6, 2010, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19, 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Final Office Action, dated Dec. 9, 2009, issued in U.S. Appl. No. 11/963,698.
US Office Action, dated Jun. 11, 2010, issued in U.S. Appl. No. 11/963,698.
US Final Office Action, dated Dec. 30, 2010, issued in U.S. Appl. No. 11/963,698.
US Notice of Allowance, dated Sep. 2, 2011, issued in U.S. Appl. No. 11/963,698.
US Office Action, dated Apr. 16, 2012, issued in U.S. Appl. No. 13/276,170.
US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Office Action dated Oct. 21, 2009, issued in U.S. Appl. No. 12/202,126.
US Final Office Action, dated May 7, 2010, issued in U.S. Appl. No. 12/202,126.
US Office Action, dated Jul. 26, 2010 issued in U.S. Appl. No. 12/202,126.
US Final Office Action, dated Feb. 7, 2011, issued in U.S. Appl. No. 12/202,126.
US Office Action, dated Jan. 7, 2013, issued in U.S. Appl. No. 12/202,126.
US Notice of Allowance, dated Jun. 7, 2013, issued in U.S. Appl. No. 12/202,126.
US Office Action, dated May 3, 2010, issued in U.S. Appl. No. 12/407,541.
US Final Office Action, dated Oct. 19, 2010, issued in U.S. Appl. No. 12/407,541.
US Office Action, dated May 2, 2011, issued in U.S. Appl. No. 12/407,541.
US Notice of Allowance, dated Sep. 19, 2011, issued in U.S. Appl. No. 12/407,541.
US Office Action, dated Mar. 6, 2012, issued in U.S. Appl. No. 13/244,016.
US Notice of Allowance dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated May 13, 2011, issued in U.S. Appl. No. 12/755,248.
US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action dated Jul. 18, 2013, issued in U.S. Appl. No. 12/723,532.
US Notice of Allowance dated Dec. 24, 2013, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Notice of Allowance, dated Jul. 10, 2013, issued in U.S. Appl. No. 12/755,259.
US Notice of Allowance dated Sep. 4, 2013 issued in U.S. Appl. No. 12/755,259.
US Office Action, dated Dec. 18, 2014, issued in U.S. Appl. No. 14/097,160.
US Final Office Action, dated Jun. 2, 2015, issued in U.S. Appl. No. 14/097,160.
US Notice of Allowance, dated Sep. 9, 2015, issued in U.S. Appl. No. 14/097,160.
US Office Action, dated May 10, 2012, issued in U.S. Appl. No. 13/020,748.
US Final Office Action, dated Nov. 16, 2012, issued in U.S. Appl. No. 13/020,748.
US Office Action, dated Feb. 24, 2014, issued in U.S. Appl. No. 13/020,748.
US Final Office Action, dated Jul. 2, 2014, issued in U.S. Appl. No. 13/020,748.
US Office Action, dated Jan. 15, 2015, issued in U.S. Appl. No. 13/774,350.
US Office Action, dated Oct. 8, 2015, issued in U.S. Appl. No. 13/774,350.
US Office Action, dated Dec. 23, 2014, issued in U.S. Appl. No. 13/851,885.
US Office Action, dated Dec. 18, 2014, issued in U.S. Appl. No. 14/502,817.
US Final Office Action, dated Jul. 17, 2015, issued in U.S. Appl. No. 14/502,817.
US Notice of Allowance, dated Sep. 25, 2015, issued in U.S. Appl. No. 14/502,817.
US Office Action, dated Sep. 18, 2014, issued in U.S. Appl. No. 13/928,216.
US Notice of Allowance, dated Jan. 22, 2015, issued in U.S. Appl. No. 13/928,216.
US Office Action, dated Jun. 20, 2013, issued in U.S. Appl. No. 13/560,688.
US Final Office Action, dated Feb. 14, 2014, issued in U.S. Appl. No. 13/560,688.
US Notice of Allowance, dated Nov. 4, 2014, issued in U.S. Appl. No. 13/560,688.
US Office Action, dated May 29, 2015, issued in U.S. Appl. No. 13/949,092.

(56) References Cited

OTHER PUBLICATIONS

US Final Office Action, dated Jan. 14, 2016, issued in U.S. Appl. No. 13/949,092.
US Office Action, dated Jun. 14, 2013, issued in U.S. Appl. No. 13/633,798.
US Final Office Action, dated Nov. 26, 2013, issued in U.S. Appl. No. 13/633,798.
US Notice of Allowance, dated May 23, 2014, issued in U.S. Appl. No. 13/633,798.
PCT Search Report and Written Opinion, dated Jan. 19, 2005, issued in PCT/US2004/006940.
Korean First Notification of Provisional Rejection, dated Dec. 8, 2010, issued in Application No. KR 2004-0036346.
Korean Office Action, dated Jun. 13, 2011, issued in Application No. KR 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. CN 200980133560.1.
Chinese Second Office Action dated Aug. 7, 2013 issued in Application No. CN 200980133560.1.
Chinese Third Office Action dated Apr. 22, 2014 issued in Application No. CN 200980133560.1.
Chinese Fourth Office Action dated Jan. 5, 2015 issued in Application No. CN 200980133560.1.
Chinese Fifth Office Action dated May 5, 2015 issued in Application No. CN 200980133560.1.
Japanese Office Action dated Dec. 3, 2013 issued in Application No. JP 2011-525228.
Korean Office Action dated Sep. 6, 2012 issued in Application No. KR 2011-7004322.
Korean Office Action dated Jul. 19, 2013 issued in Application No. KR 2011-7004322.
Korean Office Action dated Nov. 4, 2013 issued in Application No. KR 10-2013-7027117.
Korean Office Action dated Jun. 17, 2014 issued in Application No. KR 10-2013-7027117.
Japanese Office Action dated Jun. 17, 2014 issued in Application No. JP 2010-055163.
Korean Office Action dated Mar. 21, 2013 issued in Application No. KR 10-2010-0024905.
Taiwan Office Action dated Jun. 8, 2015 issued in Application No. TW 099107504.
Korean Notification of Provisional Rejection dated Jul. 17, 2012, issued in Application No. KR 2010-0087997.
Taiwan Office Action and Search Report dated Feb. 12, 2015 issued in Application No. TW 099130354.
Taiwan Office Action (Rejection Decision) dated Oct. 28, 2015 issued in Application No. TW 099130354.
Japanese Office Action dated Mar. 4, 2014 issued in Application No. JP 2010-093522.
Korean Office Action dated Mar. 4, 2013 in Application No. KR 2010-0035449.
Taiwan Office Action dated Dec. 27, 2014 issued in Application No. TW 099111860.
Japanese Office Action dated Jul. 29, 2014 issued in Application No. JP 2010-093544.
Korean Second Office Action dated Jan. 25, 2014 in Application No. KR 10-2010-0035453.
Korean First Office Action dated Jul. 10, 2015 issued in Application No. KR 10-2014-0090283.
Taiwan Office Action dated Aug. 4, 2015 issued in Application No. TW 099111859.
PCT International Search Report and Written Opinion, dated Jun. 28, 2013, issued in PCT/US2013/033174.
PCT International Preliminary Report on Patentability and Written Opinion, dated Oct. 9, 2014, issued in PCT/US2013/033174.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chinese Office Action dated Sep. 6, 2015 issued in Application No. CN 201310320848.8.
Becker, Jill (Apr. 7, 2003) "Diffusion barrier properties of tungsten nitride films grown by atomic layer deposition from bis(*tert*-butylimido)bis(dimethylamido)tungsten and ammonia," *Applied Physics Letters*, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", *J. Electrochem. Soc.*, 143(1):296-302.
Collins et al. (Jan. 21, 2003) "Pulsed Deposition of Ultra Thin Tungsten for Plugfill of High Aspect Ratio Contacts," Presentation made at Semicon Korea, 9 pages.
Diawara, Y. et al. (1993) "Rapid thermal annealing for reducing stress in tungsten x-ray mask absorber," http://dx.doi.org/10.1116/1.586673, *Journal of Vacuum Science & Technology B* 11:296-300 (per table of contents of journal).
Elam et al. (2001) "Nucleation and Growth During Tungsten Atomic Layer Deposition on $SiO_2$ Surfaces," *Thin Solid Films*, 13pp.
Fair, James A. (1983) Presentation by Inventor "Chemical Vapor Deposition of Refractory Metal Silicides," *GENUS Incorporated*, 27 pp.
George et al. (1996) "Surface Chemistry for atomic Layer Growth", *J. Phys. Chem*, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], *Materials Transactions*, 43(7): 1585-1592.
Hoover, Cynthia (Jul. 2007) "Enabling Materials for Contact Metallization," *Praxair Electronic Materials R& D*, pp. 1-16.
Klaus et al. (2000) "Atomic layer deposition of tungsten using sequential surface chemistry with a sacrificial stripping reaction," *Thin Solid Films* 360:145-153.
Klaus et al. (2000) "Atomically Controlled Growth of Tungsten and Tungsten Nitride Using Sequential Surface Reactions," *Applied Surface Science*, pp. 162-163, 479-491.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], *Thin Solid Films*, 370:114-121.
Lai, Ken K. and Lamb, H. Henry (1995) "Precursors for Organometallic Chemical Vapor Deposition of Tungsten Carbide Films," *Chemistry Material*, 7(12):2284-2292.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of $WN_xC_y$ Thin Films by ALCVD™ Method for Diffusion Barriers in Metallization," *IITC Conference Report*, 3 pages.
Manik. P, et al. (2012) "Fermi-level unpinning and low resistivity in contacts to n-type Ge with a thin ZnO interfacial layer," *App. Phys. Lett.* 101:182105-5.
Saito et al. (2001) "A Novel Copper Interconnection Technology Using Self Aligned Metal Capping Method," *IEEE*, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4194-4199.
US Final Office Action, dated Jul. 25, 2016, issued in U.S. Appl. No. 14/738,685.

(56) References Cited

OTHER PUBLICATIONS

US Notice of Allowance, dated Oct. 13, 2016, issued in U.S. Appl. No. 14/738,685.
US Final Office Action, dated May 31, 2016, issued in U.S. Appl. No. 14/135,375.
US Notice of Allowance, dated Oct. 25, 2016, issued in U.S. Appl. No. 14/135,375.
US Office Action, dated Aug. 18, 2016, issued in U.S. Appl. No. 15/040,561.
US Office Action, dated Jul. 12, 2016, issued in U.S. Appl. No. 14/723,270.
US Office Action, dated Jul. 7, 2016, issued in U.S. Appl. No. 14/989,444.
US Office Action, dated Jun. 2, 2016, issued in U.S. Appl. No. 13/774,350.
US Notice of Allowance, dated Aug. 3, 2016, issued in U.S. Appl. No. 13/851,885.
US Office Action, dated Sep. 2, 2016, issued in U.S. Appl. No. 14/965,806.
US Office Action, dated Sep. 19, 2016, issued in U.S. Appl. No. 13/949,092.
Chinese First Office Action dated Feb. 26, 2016, issued in CN 201380022648.2.
Chinese First Office Action dated Mar. 18, 2016 issued in Application No. CN 201380022693.8.
Chinese Second Office Action dated May 16, 2016 issued in Application No. CN 201310320848.8.
US Final Office Action, dated Dec. 30, 2016, issued in U.S. Appl. No. 15/040,561.
US Notice of Allowance, dated Nov. 18, 2016, issued in U.S. Appl. No. 14/723,270.
US Notice of Allowance, dated Jan. 20, 2017, issued in U.S. Appl. No. 14/989,444.
US Final Office Action, dated Jan. 18, 2017, issued in U.S. Appl. No. 13/774,350.
US Notice of Allowance, dated Dec. 14, 2016, issued in U.S. Appl. No. 13/851,885.
US Notice of Allowance, dated Mar. 24, 2017, issued in U.S. Appl. No. 13/851,885.
Taiwan Search Report dated Nov. 30, 2016 issued in Application No. TW 099130354.
Taiwan Office Action dated Jan. 10, 2017 issued in Application No. TW 105105984.
Japanese Office Action dated Jan. 24, 2017, issued in JP 2015-514160.
Taiwan Office Action and Search Report dated Nov. 22, 2016 issued in Application No. TW 102110937.
Chinese Second Office Action dated Jan. 23, 2017 issued in Application No. CN 201380022693.8.
Japanese Notification of Reasons for Rejection dated Dec. 20, 2016 issued in Application No. JP 2015-503547.
Taiwan Office Action dated Oct. 25, 2016 issued in Application No. TW 102110947.
Taiwan Examination Report dated Dec. 26, 2016 issued in Application No. TW 102123248.
Taiwan Examination Report dated Oct. 26, 2016 issued in Application No. TW 102126976.
Taiwan Examination Report dated Oct. 26, 2016 issued in Application No. TW 102126696.
Taiwan Examination Report dated Mar. 16, 2017 issued in Application No. TW 102132433.
U.S. Appl. No. 15/398,462, filed Jan. 4, 2017, Bamnolker et al.
U.S. Appl. No. 15/415,800, filed Jan. 25, 2017, Bamnolker et al.

\* cited by examiner

FIG. 1A  FIG. 1B

Constrictions
151

TUNGSTEN FILMS HAVING LOW FLUORINE CONTENT

BACKGROUND

Deposition of tungsten-containing materials using chemical vapor deposition (CVD) techniques is an integral part of many semiconductor fabrication processes. These materials may be used for horizontal interconnects, vias between adjacent metal layers, contacts between first metal layers and devices on the silicon substrate, and high aspect ratio features. In a conventional deposition process, a substrate is heated to a predetermined process temperature in a deposition chamber, and a thin layer of tungsten-containing material that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$).

SUMMARY

One aspect of the subject matter described herein relates to a method of depositing a low-fluorine tungsten-containing film on a substrate. The method involves exposing the substrate to alternating pulses of a fluorine-containing tungsten precursor and a reducing agent to thereby deposit the tungsten-containing film on the substrate, where a chamber pressure of a chamber housing the substrate during the fluorine-containing tungsten precursor pulses is less than 10 Torr. The fluorine concentration in the tungsten-containing film may be less than $10^{19}$ atoms/cm$^3$. In some embodiments, the fluorine concentration in the tungsten film is less than $10^{18}$ atoms/cm$^3$. According to various embodiments, the chamber pressure may be less than 7 Torr or less than 5 Torr. In some embodiments, the tungsten-containing film is a tungsten nucleation layer. In some embodiments, the tungsten-containing film is deposited on a first tungsten-containing film deposited via a fluorine-free process. In some embodiments, the tungsten-containing film is deposited on a barrier layer. Examples of reducing agents include silicon-containing, boron-containing, and germanium-containing reducing agents. In some embodiments, the fluorine-containing tungsten precursor pulses include hydrogen ($H_2$). According to various embodiments, the tungsten-containing film may have low resistivity, for example, less than 130 µΩ/cm or less than 110 µΩ/cm. The method may further include depositing a tungsten bulk layer by chemical vapor deposition (CVD) on the tungsten-containing film.

Another aspect of the subject matter described herein relates to a method including depositing a first tungsten-containing film on a substrate by a fluorine-free process and depositing a second tungsten-containing film the first tungsten film by atomic layer deposition using a fluorine-containing precursor, where a chamber pressure of a chamber housing the substrate during deposition of the second tungsten-containing film is less than 10 Torr. In some embodiments, the first tungsten-containing film is deposited on a barrier layer. In some embodiments, the first tungsten-containing film is deposited on a silicon oxide. According to various embodiments, the chamber pressure may be less than 7 Torr or less than 5 Torr. According to various embodiments, the fluorine concentration in the second tungsten-containing film is less than $10^{19}$ atoms/cm$^3$ or less than $10^{18}$ atoms/cm$^3$.

Further aspects can be implemented in apparatus configured to implement any of the methods described herein. For example, another aspect of the subject matter described herein relates to an apparatus for processing substrates, including (a) at least one process chamber comprising a pedestal configured to hold a substrate; (b) at least one outlet for coupling to a vacuum; (c) one or more process gas inlets coupled to one or more process gas sources; and (d) a controller for controlling operations in the apparatus, the controller including machine-readable instructions for introducing a reducing agent and a fluorine-containing tungsten precursor in alternating pulses to the process chamber, where the chamber pressure is less than 10 Torr.

These and other aspects are described further with reference to the Figures.

BRIEF DESCRIPTION OF DRAWINGS

FIGS. 1A-1G are schematic examples of various structures in which a low fluorine layer may be deposited using a fluorine-containing precursor according to the processes described herein.

DETAILED DESCRIPTION

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific implementations, it will be understood that it is not intended to limit the invention to the implementations.

Described herein are methods of tungsten deposition and related systems and apparatus. Examples of applications include logic and memory contact fill, DRAM buried wordline fill, vertically integrated memory gate/wordline fill, and 3-D integration with through-silicon vias (TSVs). In some embodiments, the methods may be used for tungsten feature fill. Such features can include vertical features, such as vias, and horizontal features, such as vertical NAND (VNAND) wordlines. The methods may be used for conformal or bottom-up/inside-out fill.

Aspects of the methods and apparatus described herein relate to deposition of tungsten-containing layers such as tungsten nucleation layers. Various embodiments of the methods involve exposing a substrate to alternating pulses of a tungsten precursor and a reducing agent at low chamber pressure to thereby deposit a tungsten nucleation layer on the surface of the substrate. According to various embodiments, chamber pressure may be maintained at or below 10 Torr. In some embodiments, chamber pressure may be maintained at or below 7 Torr, or even lower, such as at or below 5 Torr. The methods may be implemented with a fluorine-containing tungsten precursor, but result in very low or undetectable amounts of fluorine in the deposited nucleation layer.

Figure 1D:
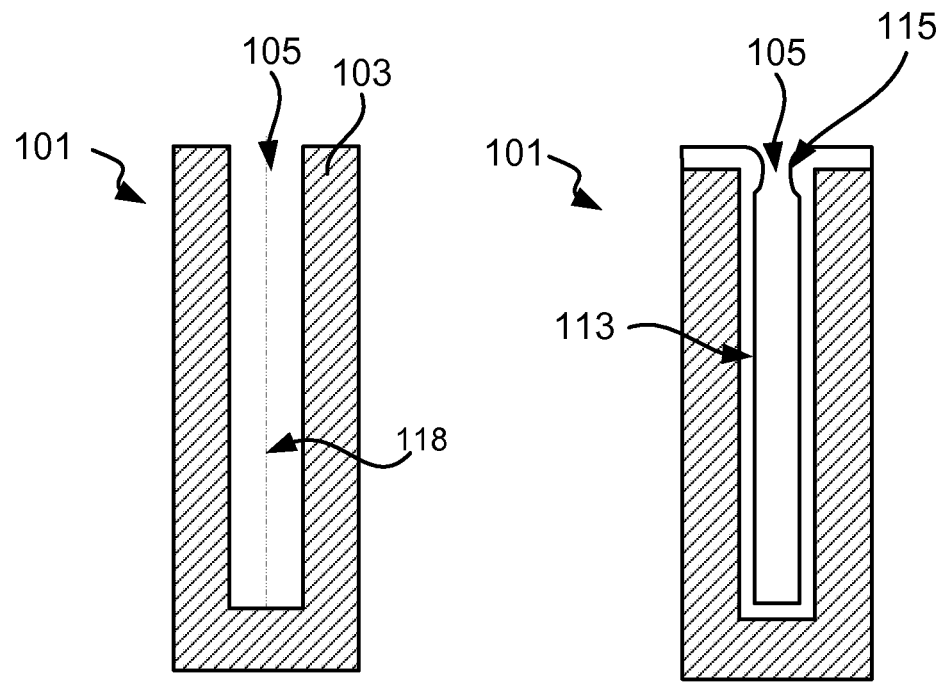
Figure 1D:
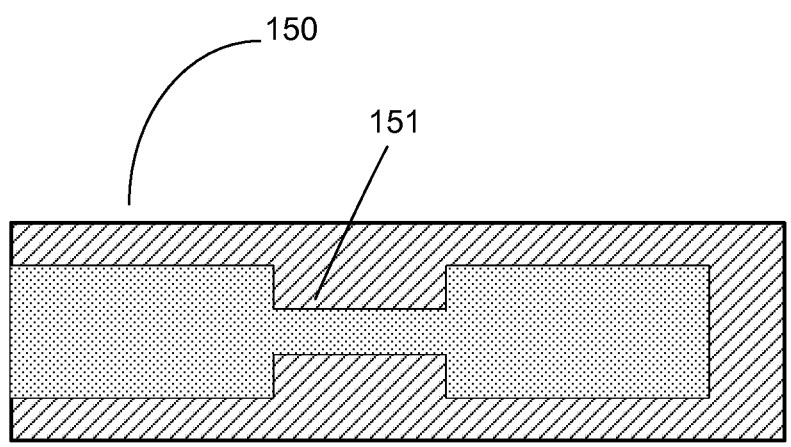

FIGS. 1A-1G are schematic examples of various structures in which a low fluorine layer may be deposited using a fluorine-containing precursor according to the processes described herein. In some embodiments, the structures include features to be filled with tungsten or a tungsten-containing material. In some embodiments, a feature can be characterized by one or more of: a narrow opening, a re-entrant opening, constrictions within the feature, and a high aspect ratio. FIG. 1A shows an example of a cross-sectional depiction of a vertical feature 101 to be filled with tungsten. The feature can include a feature hole 105 in a substrate 103. The substrate may be a silicon wafer, e.g., a 200-mm wafer, a 300-mm wafer, or a 450-mm wafer, including wafers having one or more layers of material such as dielectric, conducting, or semi-conducting material deposited thereon. The feature may be formed in one or more of these layers. For example, the feature may be formed at least partially in a dielectric layer. In some implementations, the feature hole 105 may have an aspect ratio of at least about 2:1, at least about 4:1, at least about 6:1 or higher. The feature hole 105 may also have a dimension near the opening, e.g., an opening diameter or line width, of between about 10 nm to 500 nm, for example between about 25 nm to 300 nm. The feature hole 105 can be referred to as an unfilled feature or simply a feature. The feature 101, and any feature, may be characterized in part by an axis 118 that extends through the length of the feature, with vertically-oriented features having vertical axes and horizontally-oriented features having horizontal axes.

FIG. 1B shows an example of a feature 101 that has a re-entrant profile. A re-entrant profile is a profile that narrows from a bottom, closed end, or interior of the feature to the feature opening. According to various implementations, the profile may narrow gradually and/or include an overhang at the feature opening. FIG. 1B shows an example of the latter, with an under-layer 113 lining the sidewall or interior surfaces of the feature hole 105. The under-layer 113 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations an under-layer can be one or more of Ti, TiN, WN, TiAl, and W. The under-layer 113 forms an overhang 115 such that the under-layer 113 is thicker near the opening of the feature 101 than inside the feature 101.

Figure 1C:
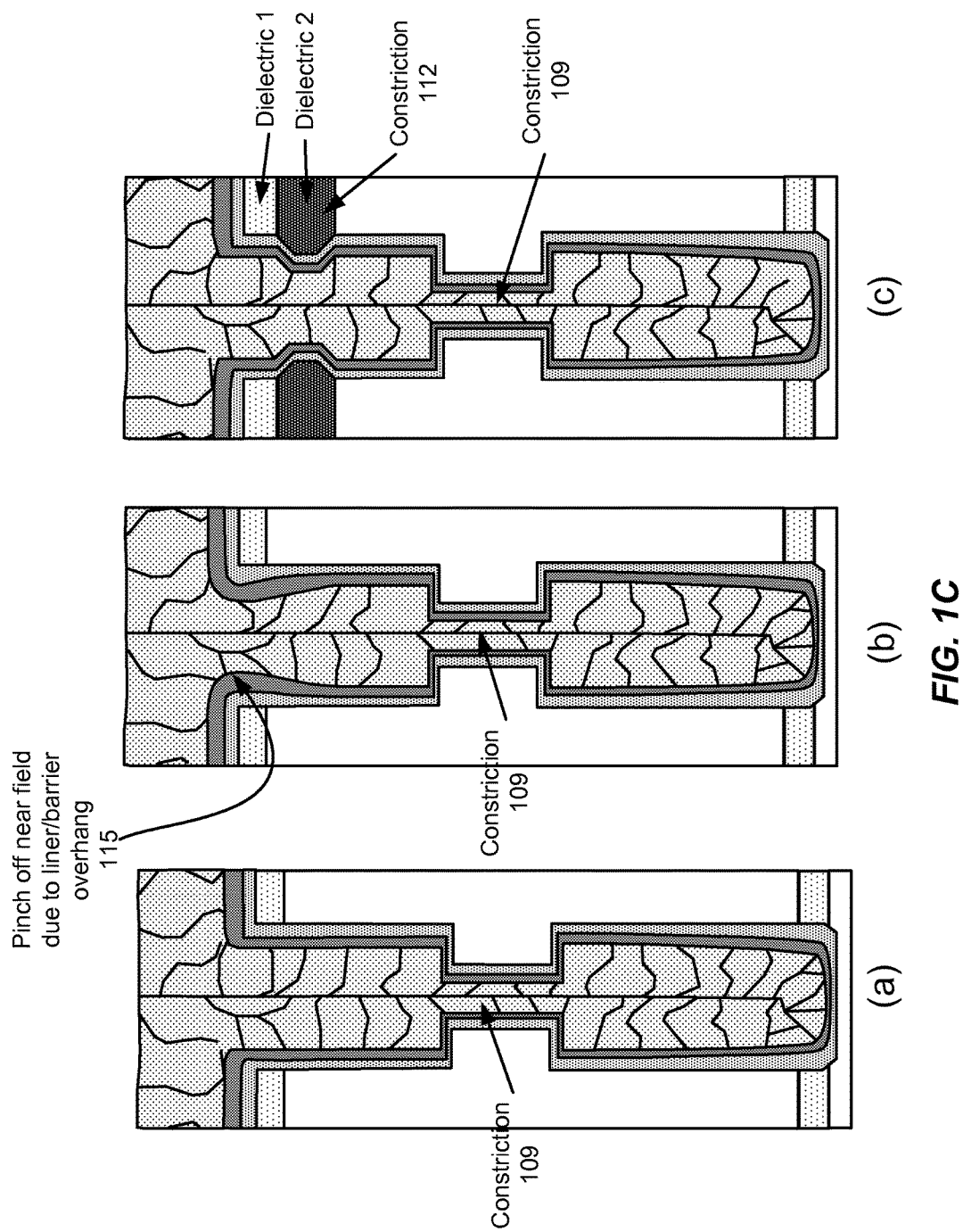

In some implementations, features having one or more constrictions within the feature may be filled. FIG. 1C shows examples of views of various filled features having constrictions. Each of the examples (a), (b) and (c) in FIG. 1C includes a constriction 109 at a midpoint within the feature. The constriction 109 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b).

Horizontal features, such as in 3-D memory structures, can also be filled. FIG. 1D shows an example of a horizontal feature 150 that includes a constriction 151. For example, horizontal feature 150 may be a word line in a VNAND structure.

Figure 1E:
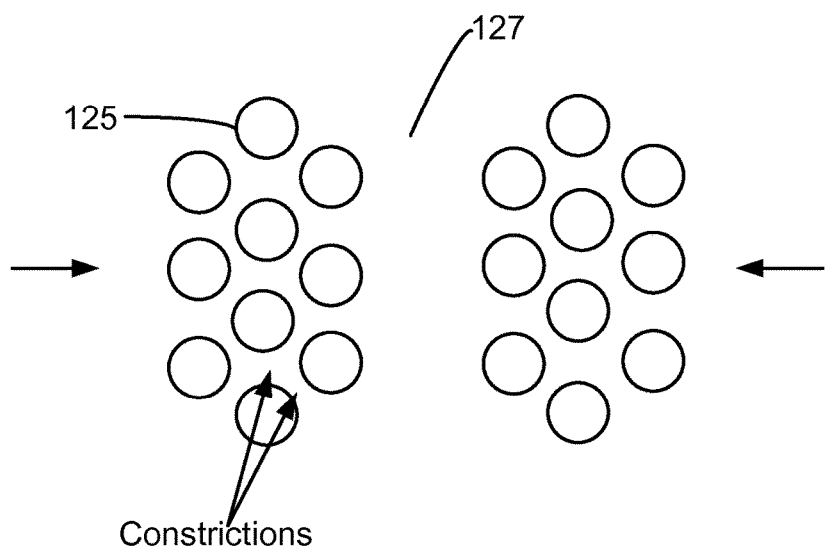
Figure 1F:
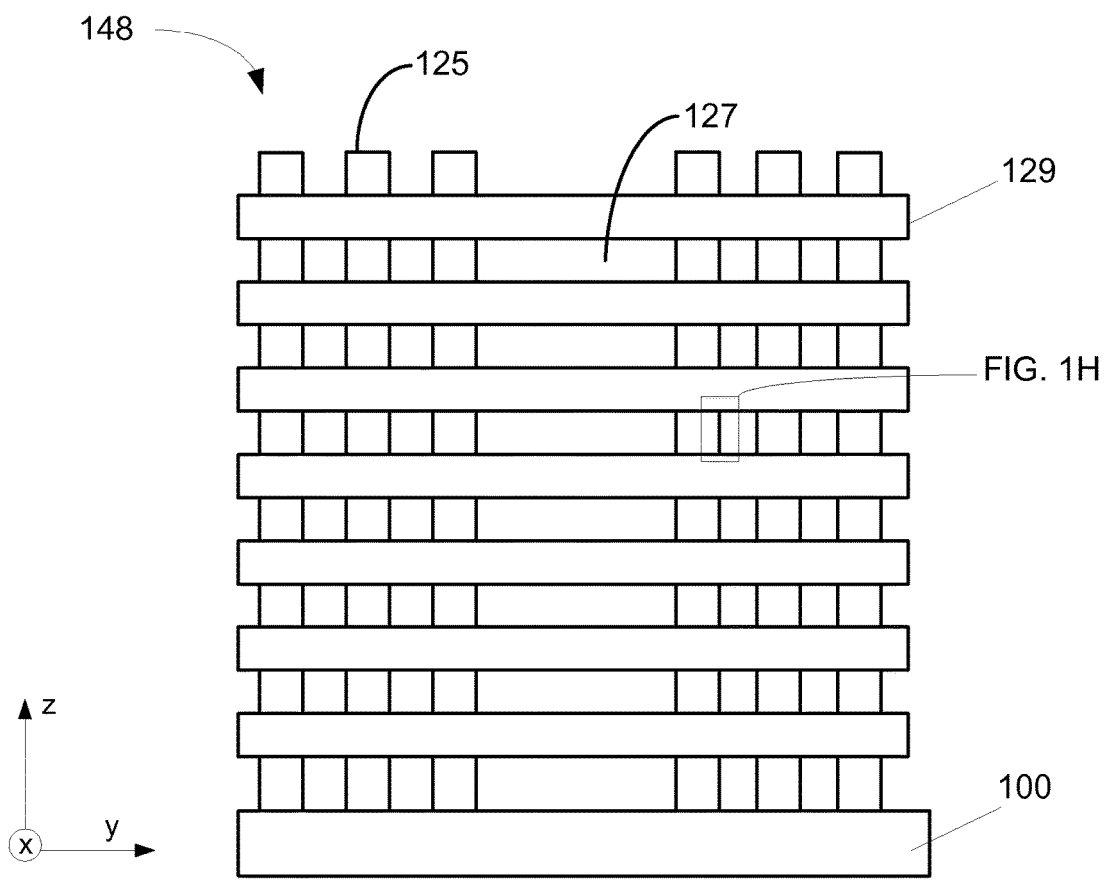

In some implementations, the constrictions can be due to the presence of pillars in a VNAND or other structure. FIG. 1E, for example, shows a plan view of pillars 125 in a VNAND or vertically integrated memory (VIM) structure 148, with FIG. 1F showing a simplified schematic of a cross-sectional depiction of the pillars 125. Arrows in FIG. 1E represent deposition material; as pillars 125 are disposed between an area 127 and a gas inlet or other deposition source, adjacent pillars can result in constrictions 151 that present challenges in void free fill of an area 127.

The structure 148 can be formed, for example, by depositing a stack of alternating interlayer dielectric layers 154 and sacrificial layers (not shown) on a substrate 100 and selectively etching the sacrificial layers. The interlayer dielectric layers may be, for example, silicon oxide and/or silicon nitride layers, with the sacrificial layers a material selectively etchable with an etchant. This may be followed by etching and deposition processes to form pillars 125, which can include channel regions of the completed memory device.

The main surface of substrate 100 can extend in the x and y directions, with pillars 125 oriented in the z-direction. In the example of FIGS. 1E and 1F, pillars 125 are arranged in an offset fashion, such that pillars 125 that are immediately adjacent in the x-direction are offset with each other in the y-direction and vice versa. According to various implementations, the pillars (and corresponding constrictions formed by adjacent pillars) may be arranged in any number of manners. Moreover, the pillars 125 may be any shape including circular, square, etc. Pillars 125 can include an annular semi-conducting material, or circular (or square) semi-conducting material. A gate dielectric may surround the semi-conducting material. The area between each interlayer dielectric layer 129 can be filled with tungsten; thus structure 148 has a plurality of stacked horizontally-oriented features that extend in the x and/or y directions to be filled.

Figure 1G:
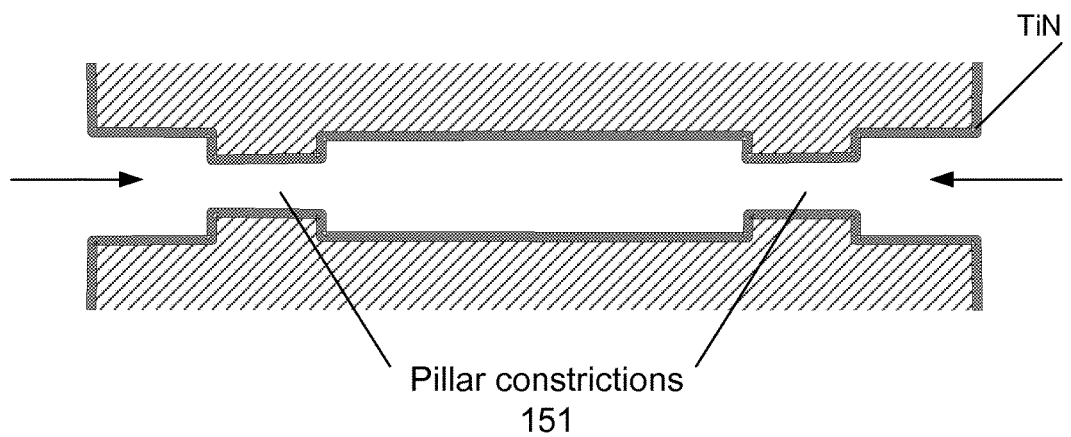

FIG. 1G provides another example of a view horizontal feature, for example, of a VNAND or other structure including pillar constrictions 151. The example in FIG. 1G is open-ended, with material to be deposited able to enter horizontally from two sides as indicated by the arrows. (It should be noted that example in FIG. 1G can be seen as a 2-D rendering 3-D features of the structure, with the FIG. 1G being a cross-sectional depiction of an area to be filled and pillar constrictions shown in the figure representing constrictions that would be seen in a plan rather than cross-sectional view.) In some implementations, 3-D structures can be characterized with the area to be filled extending along two or three dimensions (e.g., in the x and y or x, y and z-directions in the example of FIG. 1F), and can present more challenges for fill than filling holes or trenches that extend along one or two dimensions. For example, controlling fill of a 3-D structure can be challenging as deposition gasses may enter a feature from multiple dimensions.

Examples of feature fill for horizontally-oriented and vertically-oriented features are described below. It should be noted that in most cases, the examples applicable to both horizontally-oriented or vertically-oriented features. Moreover, it should also be noted that in the description below, the term "lateral" may be used to refer to a direction generally orthogonal to the feature axis and the term "vertical" to refer to a direct generally along the feature axis.

Distribution of a material within a feature may be characterized by its step coverage. For the purposes of this description, "step coverage" is defined as a ratio of two thicknesses, i.e., the thickness of the material inside the feature divided by the thickness of the material near the opening. For purposes of this description, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening.

While the description below focuses on tungsten feature fill, aspects of the disclosure may also be implemented in filling features with other materials. For example, feature fill using one or more techniques described herein may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC) and titanium alumide (TiAl)), tantalum-containing materials (e.g., tantalum (Ta), and tantalum nitride (TaN)), and nickel-containing materials (e.g., nickel (Ni) and nickel silicide (NiSi). Further, the methods and apparatus disclosed herein are not limited to feature fill, but can be used to deposit tungsten on any appropriate surface including forming blanket films on planar surfaces.

In some embodiments, the methods described herein involve deposition of a tungsten nucleation layer prior to deposition of a bulk layer. A nucleation layer is typically a thin conformal layer that facilitates subsequent deposition of bulk tungsten-containing material thereon. According to various embodiments, a nucleation layer may be deposited prior to any fill of the feature and/or at subsequent points during fill of the feature with tungsten or a tungsten-containing material.

In certain implementations, the nucleation layer is deposited using a pulsed nucleation layer (PNL) technique. In a PNL technique, pulses of a reducing agent, optional purge gases, and tungsten-containing precursor are sequentially injected into and purged from the reaction chamber. The process is repeated in a cyclical fashion until the desired thickness is achieved. PNL broadly embodies any cyclical process of sequentially adding reactants for reaction on a semiconductor substrate, including atomic layer deposition (ALD) techniques. PNL techniques for depositing tungsten nucleation layers are described in U.S. Pat. Nos. 6,635,965; 7,005,372; 7,141,494; 7,589,017, 7,772,114, 7,955,972 and 8,058,170, and U.S. Patent Publication No. 2010-0267235, all of which are incorporated by reference herein in their entireties. Nucleation layer thickness can depend on the nucleation layer deposition method as well as the desired quality of bulk deposition. In general, nucleation layer thickness is sufficient to support high quality, uniform bulk deposition. Examples may range from 5 Å-100 Å.

Figure 2:
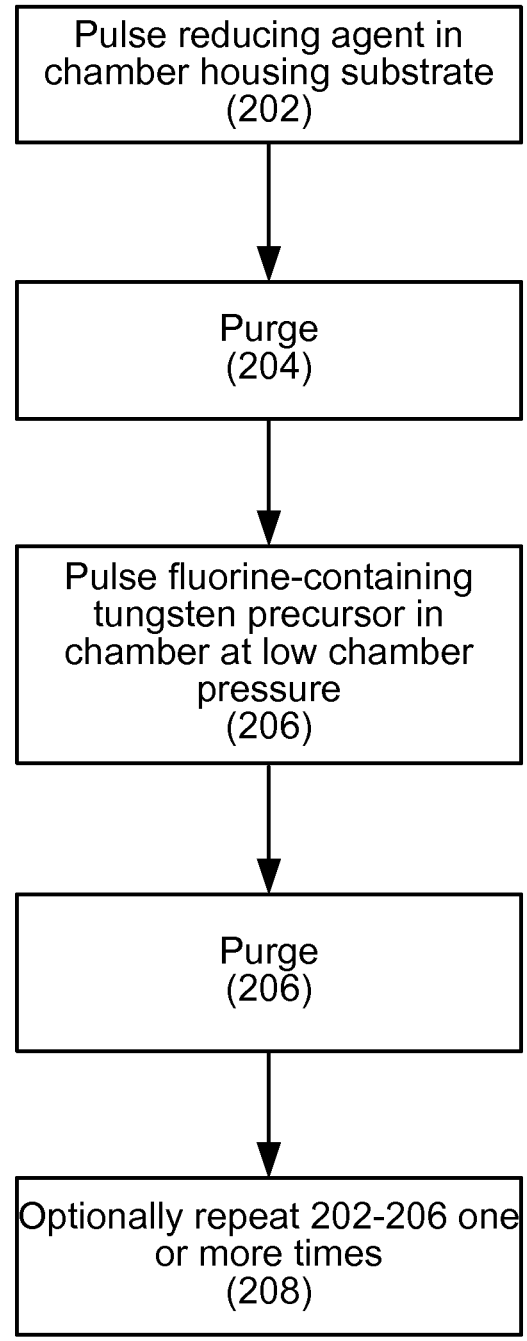
FIG. 2 is a process flow diagram illustrating certain operations in an example of a method of depositing a tungsten nucleation layer.

Fluorine (F) in deposited tungsten films and tungsten precursors may react during further integration operations to form highly reactive hydrofluoric acid (HF). HF can eat into oxide in oxide stacks, for example, or otherwise negatively affect integration. Conventional methods of depositing tungsten nucleation layers that use fluorinated precursors, such as tungsten hexafluoride ($WF_6$), result in some amount of fluorine in the nucleation layers. FIG. 2 is a process flow diagram illustrating certain operations in an example of a method of depositing a tungsten nucleation layer. The method described with reference to FIG. 2 results in a tungsten nucleation layer having low fluorine content.

The method described below with reference to FIG. 2 involves exposing a substrate to alternating pulses of a reducing agent and fluorine-containing tungsten precursor. According to various embodiments, exposure to these alternating pulses may involve temporal switching or spatial switching. Temporal switching may be performed if the substrate remains stationary in a particular environment such as a chamber. Spatial switching may involve moving the substrate to a different environment. While the below description chiefly refers to temporal switching (and so assumes that the substrate remains in a particular chamber environment throughout the deposition), it is understood that the method can also be implemented by spatial switching.

At block 202, the process involves pulsing a reducing agent in a chamber housing a wafer or other substrate. The reducing agent is a compound that can reduce (and/or forming a decomposition product that can reduce) a tungsten precursor to form tungsten (W). The reducing agent may be a stronger reducing agent than hydrogen ($H_2$), with examples including silicon-containing reducing agents such as silanes, boron-containing reducing agents such as boranes, and germanium-reducing agents such as germanes. Specific examples include silane ($SiH_4$), disilane ($Si_2H_6$), borane ($BH_3$), diborane ($B_2H_6$), germane ($GeH_4$) and digermane ($Ge_2H_6$). Other reducing agents such as hydrazines may be employed. In some embodiments, the reducing agent or a decomposition product thereof may be adsorbed or other otherwise deposited onto the substrate surface and available to react. At block 204, excess reducing agent that is not deposited on the substrate surface is purged from the chamber. A purge operation may not be performed in some embodiments.

At block 206, a fluorine-containing tungsten precursor such as $WF_6$ is pulsed in the chamber housing the substrate, the chamber being at a low chamber pressure during the pulse. Low pressure is less than 10 Torr. In some implementations, the pressure is less than 7 Torr, less than 5 Torr, or 3 Torr or less.

In the example of FIG. 2, the substrate remains in a single chamber during the process. As such, the chamber may be at low pressure during any of the operations of FIG. 2. In some embodiments, the chamber pressure is substantially constant during the process. One having ordinary skill in the art will understand that a substantially constant chamber pressure includes a chamber pressure that has minor fluctuations due to the introduction of different gas flows, etc. In some embodiments, however, chamber pressure can be higher in block 202 than in block 206. The fluorine-containing tungsten precursor reacts with the reducing agent or decomposition product to form a layer or sub-layer of a tungsten film.

As described further below, by performing block 206 at low pressure, the amount of fluorine incorporated into the film is significantly reduced. Blocks 202-206 may be optionally repeated one or more times to build up a desired thickness of tungsten. Block 208. Various modifications may be made to the process depicted in FIG. 2. In some embodiments, for example, block 206 may be performed prior to block 202 such that the fluorine-containing tungsten precursor may be pulsed prior to the reducing agent pulse. As such, the fluorine-containing precursor or a decomposition product thereof may be adsorbed onto the substrate available to react with the incoming pulse of reducing agent.

Figure 3:
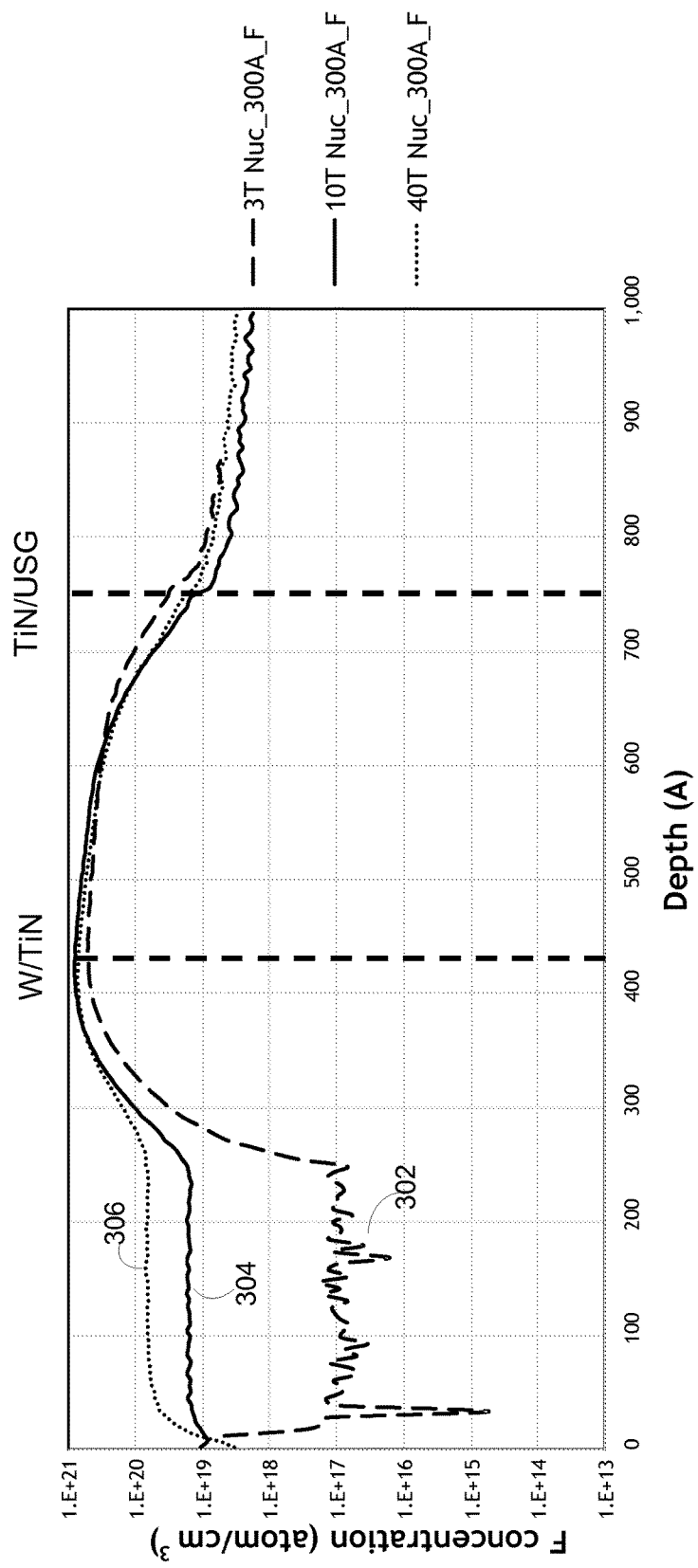
FIG. 3 is a plot showing fluorine (F) concentration profiles for tungsten (W)/titanium nitride TiN/undoped silicon glass (USG) stacks comparing F concentration for various W deposition methods.

FIG. 3 is a plot showing fluorine (F) concentration profiles for tungsten (W)/titanium nitride TiN/undoped silicon glass (USG) stacks, with profiles shown for a stack having a W layer deposited at 3 Torr, 10 Torr and 40 Torr by ALD, respectively. Tungsten hexafluoride and diborane were used as the tungsten precursor and reducing agent, respectively. Each profile is characterized by a relatively flat portion up to a depth of about 275 Å, followed by a rise in F concentration at the W/TiN interface, and a decrease as the depth increases into the TiN/USG interface and USG layer. The rise shown in the W layer is an artifact of the measurement process, and likely reflects F content in the TiN layer. As such, the F content in the W layer is best indicated by the flat portion of the profile.

Notably, while the 10 Torr film (line 304) has significantly lower fluorine content than the 40 Torr film (line 306), the ALD film deposited at less than 10 Torr (line 302) has over 100× fluorine content reduction as compared to films deposited at 10 Torr (line 304) and 40 Torr (line 306). The flat portion of line 302 is at $10^{17}$ atoms/cm$^3$, below the detection level of the tool used to measure fluorine, indicating that the fluorine level may be lower than $10^{17}$ atoms/cm$^3$. This measurement level also corresponds to tungsten deposited using a fluorine-free precursor, indicating that the low pressure (<10 Torr) process may be used to deposit an essentially fluorine-free tungsten nucleation layer using a fluorine-containing precursor.

Figure 4:
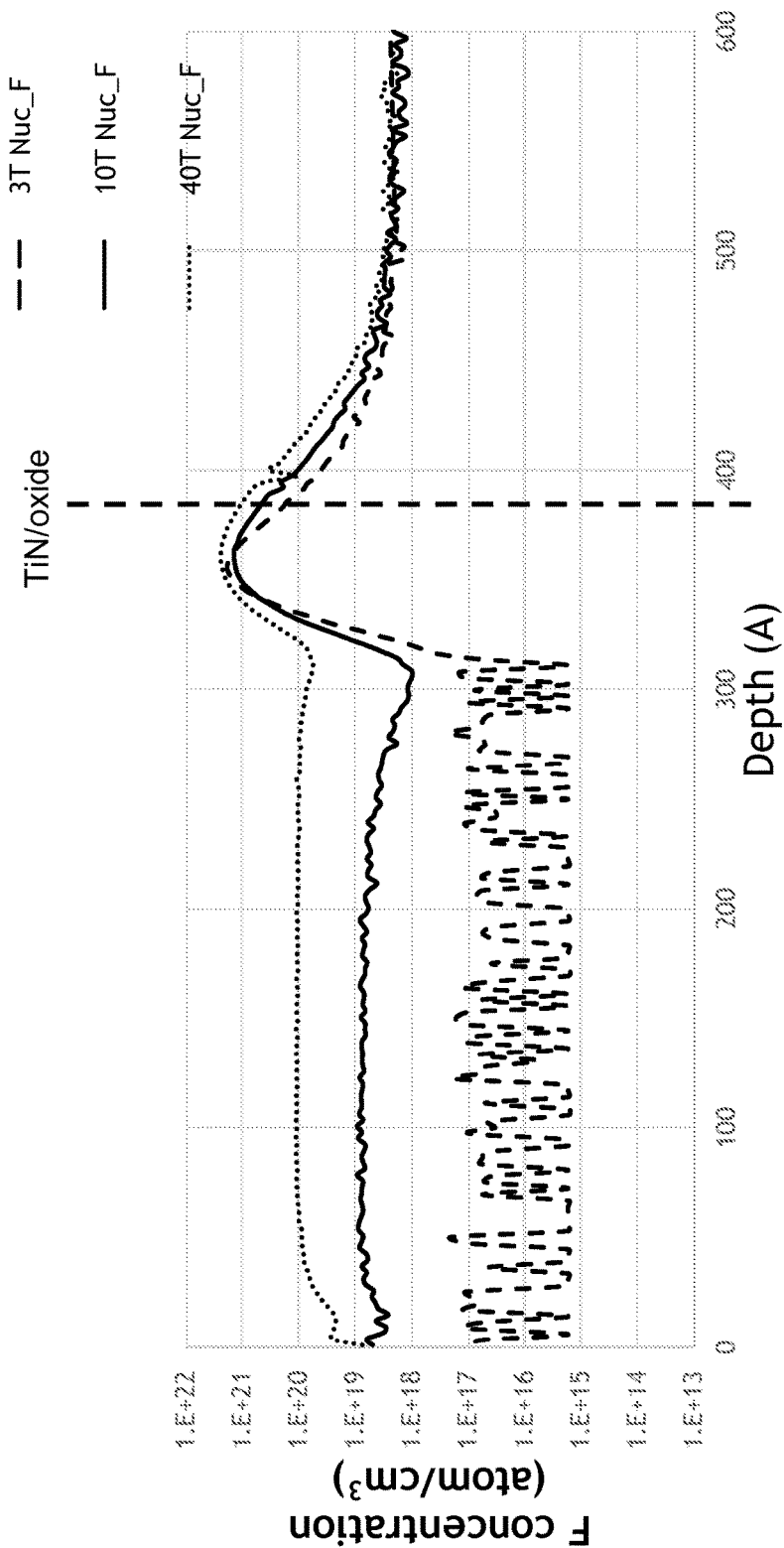
FIG. 4 is a plot showing F concentration profiles for W/TiN/thermal oxide stacks with thin TiN layers comparing F concentration for various W deposition methods.

The low pressure process also reduces the amount of fluorine in an underlying dielectric layer in some embodiments. FIG. 4 is a plot showing fluorine F concentration profiles for tungsten W/TiN/thermal oxide with the W deposited by ALD on thin (30 Å) TiN barrier layers. Profiles of three 300 Å W nucleation/30 Å TiN/1000 Å thermal oxide stacks are shown, with the 300 Å W tungsten nucleation layers deposited at 3 Torr, 10 Torr and 40 Torr, respectively. Here, the F concentration in the 3 Torr W layer is below the F detection level (as in FIG. 3). Further, the lower pressure process results in lower F concentration in the thermal oxide layer.

Figure 5:
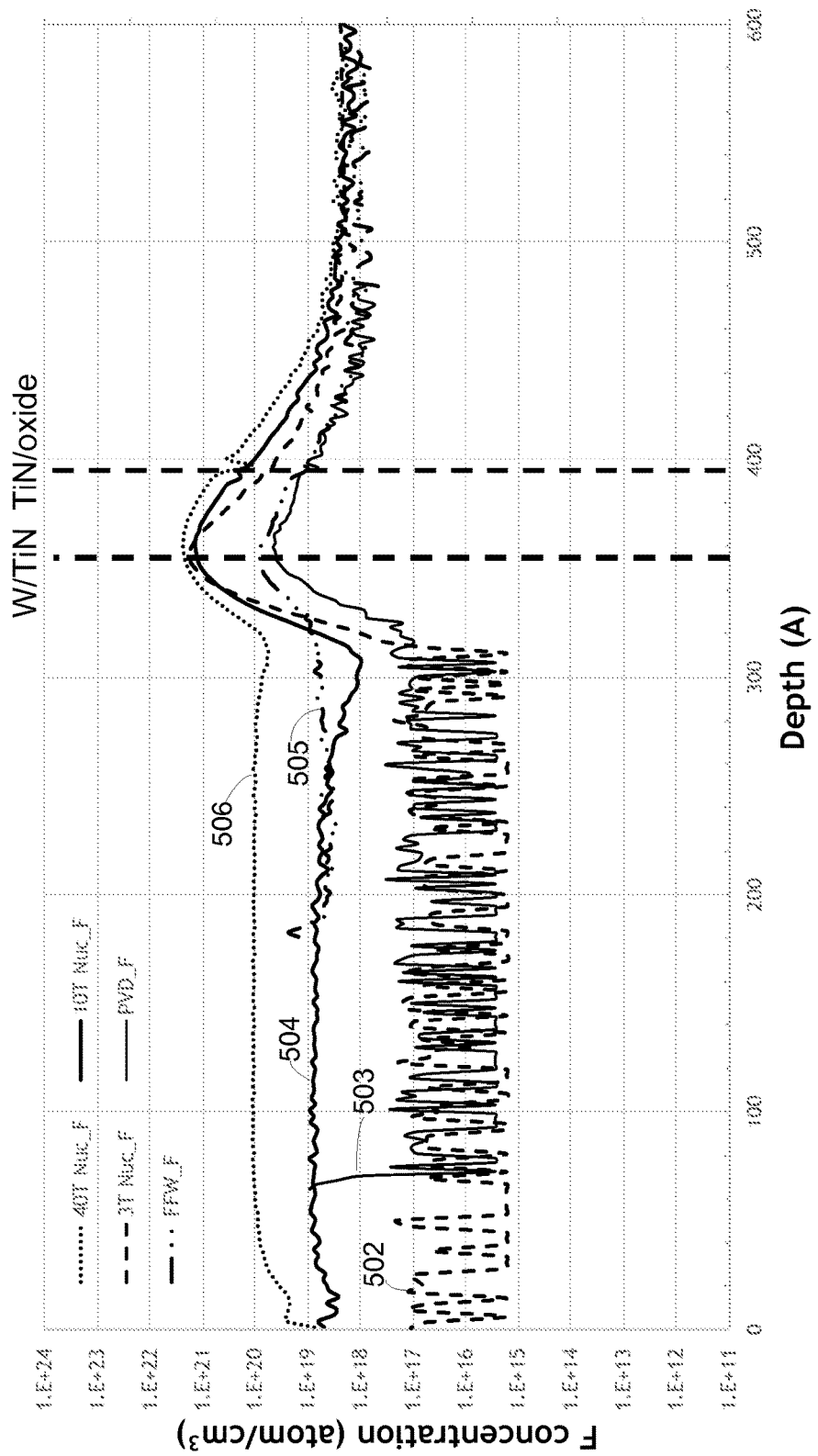
FIG. 5 is a plot showing F concentration profiles for W/TiN/thermal oxide stacks comparing F concentration for various W deposition methods.

As indicated above, the low pressure ALD deposition of a tungsten nucleation layer using a fluorine-containing tungsten precursor results in fluorine content comparable to films deposited using fluorine-free precursors or by physical vapor deposition (PVD) of a solid tungsten target. FIG. 5 is a plot showing F concentration profiles for W/TiN/thermal oxide stacks. Profiles are shown for the following W deposition methods: ALD at 40 Torr using WF$_6$ (line 506), ALD at 10 Torr using WF$_6$ (line 504), ALD at 3 Torr using WF$_6$ (line 502), ALD at 40 Torr using a fluorine-free tungsten (FFW) precursor (line 505), and PVD (line 503).

FIG. 5 shows that the F percentage in the bulk of the W ALD film is greatest for the 40 Torr ALD process, followed by the 10 Torr ALD process. F content in the 10 Torr ALD film is approximately equal to that in the FFW film. The F content is lowest in the 3 Torr ALD and PVD films. Notably, there is less F measured in the 3 Torr WF$_6$ film than a FFW film.

At the TiN/oxide interface, the F content is highest for the 40 Torr ALD film, followed by (in order) the 10 Torr ALD film, the 3 Torr ALD film, and the FFW and PVD films.

The non-linear correlation of fluorine content to chamber pressure seen in FIGS. 3-5 was unexpected, in part because fluorine in WF$_6$-based ALD deposited films is generally fairly unresponsive to variations in other process parameters such as temperature. Raising the substrate temperature can reduce fluorine content to some extent, but not enough to approach that of a FFW film. Further, an increase in temperature results in a decrease in step coverage. By contrast, the low pressure processes disclosed herein can result in excellent step coverage (e.g., at least 90%). It should also be noted that CVD deposition using fluorine-based tungsten precursors does not respond to chamber pressure in the manner shown in FIGS. 3-5. Without being bound by a particular theory, it is believed that low chamber pressure during an ALD process may allow fluorine (F$_2$) or other F-containing byproducts of the reaction to diffuse out of the W film or leave the surface of the W film as it is deposited.

In the process of FIG. 2, a carrier gas may be used to deliver the reactants to the chamber. If used, the carrier gas typically has a much higher flow rate than the reactants such that the chamber pressure may be approximated by the partial pressure of the carrier gas. The carrier gas may also function as the purge gas between reactant pulses, or a separate purge gas may be used. An inert component such as argon, xenon, krypton, nitrogen, or helium may be used as a carrier gas.

According to various implementations, hydrogen may or may not be run in the background in addition to or instead of another carrier gas. In some embodiments, hydrogen is not run in the background, such that the nucleation layer deposition is a hydrogen (H$_2$)-free process. Adding H$_2$ can improve fluorine reduction, possibly due to the generation of HF.

Figure 6:
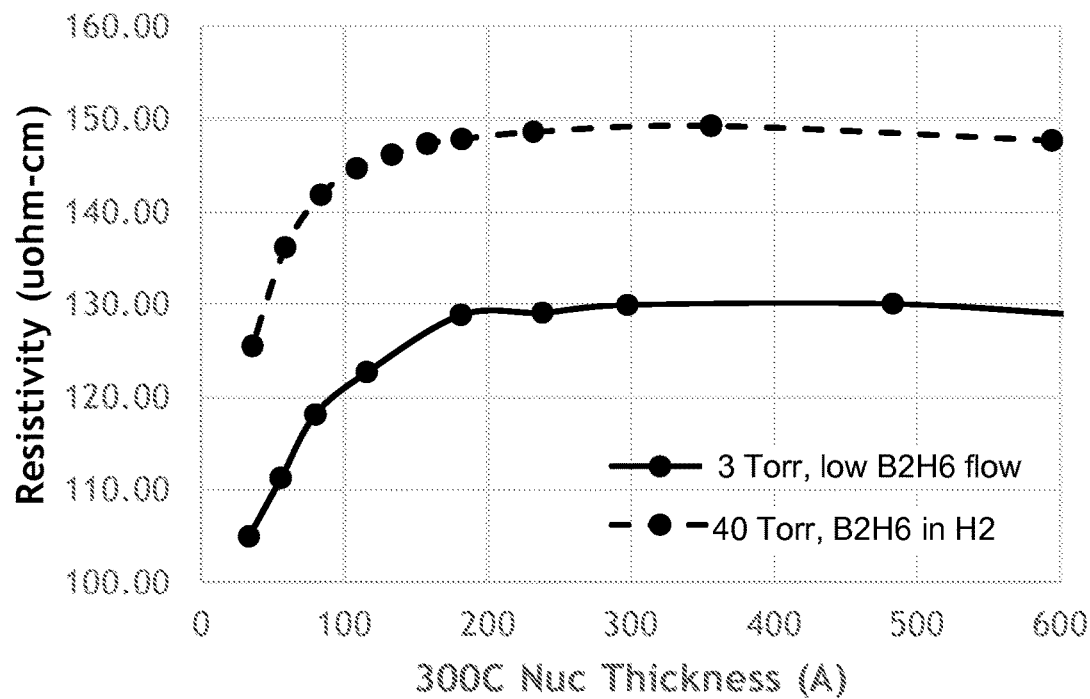
FIG. 6 shows resistivity measurements for a 40 Torr ALD process (with $H_2$ in the background) and a 3 Torr ALD process with no $H_2$.

In addition to preventing the deleterious effects of fluorine contamination, the low pressure process can result in reduced resistivity. FIG. 6 shows resistivity measurements for a 40 Torr ALD process (with H$_2$ in the background) and a 3 Torr ALD process with no H$_2$. WF$_6$ was used as the tungsten containing precursor and B$_2$H$_6$ as the reducing agent. Resistivity is significantly lower for the low pressure process, which may be due to the reduced amount of F impurity in the film. It should be noted that the films deposited in generating the data in FIG. 6 were amorphous, with the resistivity of the 3 Torr film very low for an amorphous film.

It is noted that the 3 Torr ALD depositions used to generate the data in FIGS. 3-6 were performed on different tools than the 10 Torr and 40 Torr ALD depositions due to limitations in the tool used to deposit at 10 Torr and 40 Torr.

Figure 7:
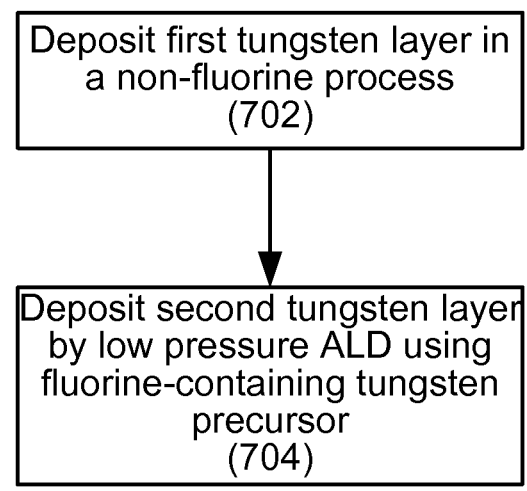
FIG. 7 is a process flow diagram illustrating certain operations in an example of a method of depositing tungsten.

In some embodiments, a first tungsten layer may be deposited by a fluorine-free process prior to depositing a tungsten layer by ALD at low pressure using a fluorine-containing tungsten precursor. Such processes may be useful, for example, to reduce fluorine content in an underlying layer or at an interface between layers. FIG. 7 is a process flow diagram illustrating certain operations in an example of a method of depositing tungsten. The method includes depositing a first tungsten layer in a non-fluorine process (702). The first tungsten layer may be deposited, for example, on a barrier or adhesion layer, such as a titanium (Ti), TiN, Ti/TiN, tungsten nitride (WN), or other layer. In some implementations the first tungsten may be deposited directly on a dielectric layer, such as a silicon oxide layer.

Examples of non-fluorine processes include ALD and CVD processes that use no fluorine-containing precursors. Examples of fluorine-free tungsten precursors that may be used include tungsten hexacarbonyl (W(CO)$_6$), tungsten chlorides such as tungsten hexachloride (WCl$_6$) and tungsten pentachloride (WCl$_5$), and organotungsten precursors such as W$_2$(NMe$_2$)$_6$, W(OEt)$_6$, W(OnPr)$_6$, (tBuN=)$_2$W(NMe$_2$)$_2$, (tBuN=)$_2$W(NEtMe)$_2$, W(Cp)$_2$H$_2$, W(NEt$_2$)$_2$(NEt)$_2$, W(iPrCp)$_2$H$_2$, (tBuN=)$_2$W(HNMe)$_2$, W(EtCp)$_2$H$_2$ and derivatives thereof. Further examples include ethylcyclopentadienyl-dicarbonylnitrosyl-tungsten (EDNOW), methylcyclopentadienyl-dicarbonylnitrosyl-tungsten (MDNOW), and ethylcyclopentadienyl)tricarbonylhydridotungsten (ETHW), available from Praxair, as well as tungsten bis(alkylimino)bis(alkylamino) compounds having the following structure:

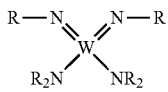

where each R may be independently selected from methyl, ethyl, propyl, butyl and tert-butyl groups. These groups may be substituted or unsubstituted, though are typically unsubstituted. For example, the tungsten-containing precursor is bis(tert-butylimino) bis(dimethylamino) tungsten (W[N(C$_4$H$_9$)]$_2$[N(CH$_3$)$_2$]$_2$.

The first tungsten layer may be deposited to a thickness sufficient to prevent fluorine from a fluorine-containing tungsten process in a subsequent deposition from reaching an underlying material. Example thicknesses may range from 10 Å to 100 Å, though thicknesses outside these ranges may be implemented.

The method continues by depositing a second tungsten layer by low pressure ALD using a fluorine-containing precursor. Block 704. The second tungsten layer may be a tungsten nucleation layer deposited directly on the first tungsten layer. Block 704 may involve a process as described above with respect to FIG. 2.

Deposition rate for block 704 may be significantly higher than for block 702. As such, block 702 may result in a fluorine-free layer that protects an underlying layer from fluorine with block 704 resulting in a faster deposition with very low fluorine content.

In some embodiments, deposition of a tungsten nucleation layer may be followed by one or more treatment operations prior to tungsten bulk deposition. Treating a deposited tungsten nucleation layer to lower resistivity is described for example in U.S. Pat. Nos. 7,772,114 and 8,058,170 and U.S. Patent Publication No. 2010-0267235, incorporated by reference herein.

Low pressure ALD deposition of a tungsten layer may be followed by tungsten bulk deposition. Tungsten bulk deposition can occur by a CVD process in which a reducing agent and a tungsten-containing precursor are flowed into a deposition chamber to deposit a bulk fill layer in the feature. An inert carrier gas may be used to deliver one or more of the reactant streams, which may or may not be pre-mixed. Unlike PNL or ALD processes, the CVD operation generally involves flowing the reactants continuously together until the desired amount is deposited. In certain implementations, the CVD operation may take place in multiple stages, with multiple periods of continuous and simultaneous flow of reactants separated by periods of one or more reactant flows diverted.

Various tungsten-containing gases including, but not limited to, WF$_6$, WCl$_6$, WCl$_5$, W(CO)$_6$ or the organotungsten precursors listed above can be used as the tungsten-containing precursor. In certain implementations, the tungsten-containing precursor is a halogen-containing compound, such as WF$_6$. In certain implementations, the reducing agent is hydrogen gas, though other reducing agents may be used including silane (SiH$_4$), disilane (Si$_2$H$_6$) hydrazine (N$_2$H$_4$), diborane (B$_2$H$_6$) and germane (GeH$_4$). In many implementations, hydrogen gas is used as the reducing agent in the CVD process. In some other implementations, a tungsten precursor that can decompose to form a bulk tungsten layer can be used. Bulk deposition may also occur using other types of processes including ALD processes. Still further, bulk deposition may occur using a sequential CVD process. Descriptions of such processes are given in concurrently-filed U.S. patent application Ser. No. 14/723,270. Examples of temperatures may range from 200° C. to 500° C. According to various implementations, any of the CVD W operations described herein can employ a low temperature CVD W fill, e.g., at about 250° C. to 350° C. or about 300° C.

Deposition may proceed according to various implementations until a certain feature profile is achieved and/or a certain amount of tungsten is deposited. In some implementations, the deposition time and other relevant parameters may be determined by modeling and/or trial and error. For example, for an initial deposition for an inside out fill process in which tungsten can be conformally deposited in a feature until pinch-off, it may be straightforward to determine based on the feature dimensions the tungsten thickness and corresponding deposition time that will achieve pinch-off. In some implementations, a process chamber may be equipped with various sensors to perform in-situ metrology measurements for end-point detection of a deposition operation. Examples of in-situ metrology include optical microscopy and X-Ray Fluorescence (XRF) for determining thickness of deposited films.

It should be understood that the any of the tungsten films described herein may include some amount of other compounds, dopants and/or impurities such as nitrogen, carbon, oxygen, boron, phosphorous, sulfur, silicon, germanium and the like, depending on the particular precursors and processes used. The tungsten content in the film may range from 20% to 100% (atomic) tungsten. In many implementations, the films are tungsten-rich, having at least 50% (atomic) tungsten, or even at least about 60%, 75%, 90%, or 99% (atomic) tungsten. In some implementations, the films may be a mixture of metallic or elemental tungsten (W) and other tungsten-containing compounds such as tungsten carbide (WC), tungsten nitride (WN), etc.

CVD, ALD and low pressure ALD deposition of these materials can include using any appropriate precursors. For example, CVD and ALD deposition of tungsten nitride can include using halogen-containing and halogen-free tungsten-containing and nitrogen-containing compounds as described further below. CVD and ALD deposition of titanium-containing layers can include using precursors containing titanium with examples including tetrakis(dimethylamino)titanium (TDMAT) and titanium chloride (TiCl$_4$), and if appropriate, one or more co-reactants. CVD and ALD deposition of tantalum-containing layers can include using precursors such as pentakis-dimethylamino tantalum (PDMAT) and TaF$_5$ and, if appropriate, one or more co-reactants. CVD and ALD deposition of cobalt-containing layers can include using precursors such as tris(2,2,6,6-tetramethyl-3,5-heptanedionato)cobalt, bis(cyclopentadienyl)cobalt, and dicobalt hexacarbonyl butylacetylene, and one or more co-reactants. CVD and ALD deposition of nickel-containing layers can include using precursors such as cyclopentadienylallylnickel (CpAllylNi) and MeCp$_2$Ni. Examples of co-reactants can include N$_2$, NH$_3$, N$_2$H$_4$, N$_2$H$_6$, SiH$_4$, Si$_3$H$_6$, B$_2$H$_6$, H$_2$, and AlCl$_3$. The methods described herein may be used for ALD of various films using fluorine-containing precursors.

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. In some embodiments, low pressure ALD may be performed at a station that is one of two, five, or even more deposition stations positioned within a single deposition chamber. Thus, for example, diborane and tungsten hexafluoride may be alternately introduced to the surface of the semiconductor substrate, at the station, using an individual gas supply system that creates a localized atmosphere at the substrate surface. Another station may be used for fluorine-free tungsten deposition, or CVD. Two or more stations may be used to deposit tungsten in a parallel processing. Alternatively a wafer may be indexed to have various operations performed over two or more stations sequentially.

Figure 8:
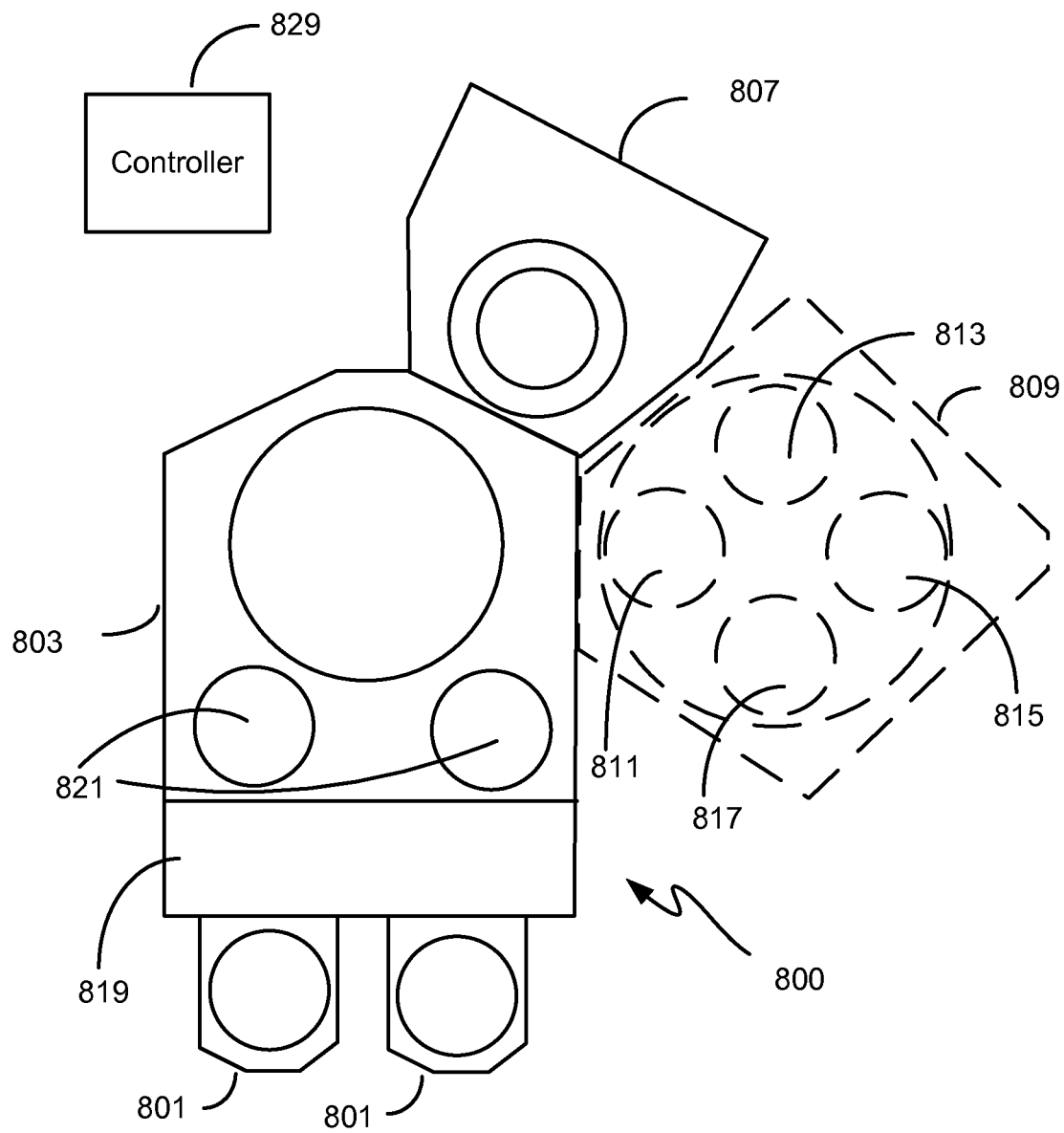
FIG. 8 is a schematic diagram of an example process tool for performing disclosed embodiments.
Figure 9:
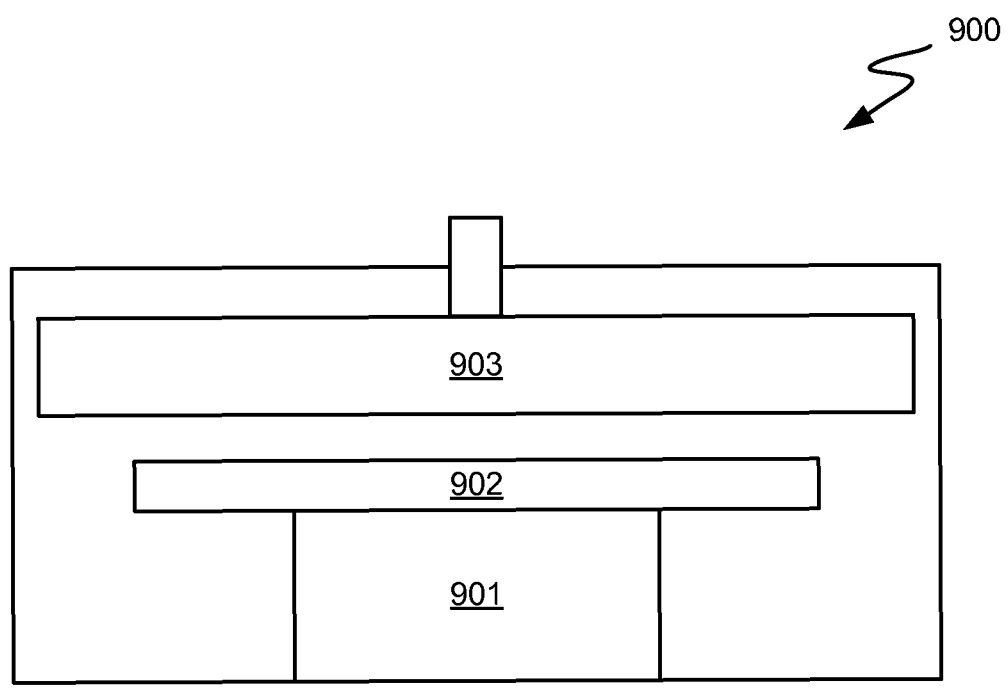
FIG. 9 is a schematic diagram of an example station for performing disclosed embodiments.

FIG. 8 is a block diagram of a processing system suitable for conducting tungsten thin film deposition processes in accordance with embodiments. The system 800 includes a transfer module 803. The transfer module 803 provides a clean, pressurized environment to minimize risk of contamination of substrates being processed as they are moved between various reactor modules. Mounted on the transfer module 803 is a multi-station reactor 809 capable of performing ALD and CVD according to embodiments. Multi-station reactor 809 may also be used to perform low pressure tungsten ALD and/or tungsten CVD in some embodiments. Multi-station reactor 809 may include multiple stations 811, 813, 815, and 817 that may sequentially perform operations in accordance with disclosed embodiments. For example, multi-station reactor 809 could be configured such that station 811 performs fluorine-free nucleation layer deposition by ALD, station 813 performs low pressure ALD, and stations 815 and 817 perform CVD. Stations may include a heated pedestal or substrate support, one or more gas inlets or showerhead or dispersion plate. An example of a deposition station 900 is depicted in FIG. 9, including substrate support 902 and showerhead 903. A heater may be provided in pedestal portion 901. The pedestal 901 may include a chuck for clamping the wafer. In certain embodiments, an electrostatic or mechanical chuck may be used rather than a vacuum chuck to facilitate providing a low pressure environment. Gases may be exhausted out of deposition station 900 by an exhaust (not shown).

Also mounted on the transfer module 803 may be one or more single or multi-station modules 807 capable of performing plasma or chemical (non-plasma) pre-cleans. The module may also be used for various treatments to, for example, prepare a substrate for a deposition process. The system 800 also includes one or more wafer source modules 801, where wafers are stored before and after processing. An atmospheric robot (not shown) in the atmospheric transfer chamber 819 may first remove wafers from the source modules 801 to loadlocks 821. A wafer transfer device (generally a robot arm unit) in the transfer module 803 moves the wafers from loadlocks 821 to and among the modules mounted on the transfer module 803.

In various embodiments, a system controller 829 is employed to control process conditions during deposition. The controller 829 will typically include one or more memory devices and one or more processors. A processor may include a CPU or computer, analog and/or digital input/output connections, stepper motor controller boards, etc.

The controller 829 may control all of the activities of the deposition apparatus. The system controller 829 executes system control software, including sets of instructions for controlling the timing, mixture of gases, chamber pressure, chamber temperature, wafer temperature, wafer chuck or pedestal position, and other parameters of a particular process. Other computer programs stored on memory devices associated with the controller 829 may be employed in some embodiments.

Typically there will be a user interface associated with the controller 829. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 829. The signals for controlling the process are output on the analog and digital output connections of the system 800.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 829 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 829, depending on the processing requirements and/or the type of system, may be programmed to control any of the processes disclosed herein, including the delivery of processing gases, temperature settings (e.g., heating and/or cooling), pressure settings, vacuum settings, power settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 829, in some implementations, may be a part of or coupled to a computer that is integrated with, coupled to the system, otherwise networked to the system, or a combination thereof. For example, the controller 829 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a PVD chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 829 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The invention claimed is:

1. A method comprising:
exposing a substrate to alternating pulses of a fluorine-containing tungsten precursor and a reducing agent to thereby deposit a tungsten-containing film on the substrate, wherein a chamber pressure of a chamber housing the substrate during the fluorine-containing tungsten precursor pulses is less than 10 Torr, and wherein the total fluorine concentration in the tungsten-containing film is less than $10^{18}$ atoms/cm$^3$.

2. The method of claim 1, wherein the chamber pressure is less than 7 Torr.

3. The method of claim 1, wherein the chamber pressure is less than 5 Torr.

4. The method of claim 1, wherein the tungsten-containing film is a tungsten nucleation layer.

5. The method of claim 1, wherein the tungsten-containing film is deposited on a first tungsten-containing film deposited via a fluorine-free process.

6. The method of claim 1, wherein the tungsten-containing film is deposited on a barrier layer.

7. The method of claim 1, wherein the reducing agent is selected from silicon-containing, boron-containing, and germanium-containing reducing agents.

8. The method of claim 1, wherein the fluorine-containing tungsten precursor pulses include hydrogen ($H_2$).

9. The method of claim 1, wherein the resistivity of the tungsten-containing film is less than 130 μΩ/cm.

10. The method of claim 1, wherein the resistivity of the tungsten-containing film is less than 110 μΩ/cm.

11. The method of claim 1, further comprising depositing a tungsten bulk layer by chemical vapor deposition (CVD) on the tungsten-containing film.

12. The method of claim 1, wherein deposition of the tungsten-containing film is a $H_2$-free process.

13. A method comprising:
depositing a first tungsten-containing film on a substrate by a fluorine-free process; and
depositing a second tungsten-containing film on the first tungsten-containing film by atomic layer deposition using a fluorine-containing precursor, wherein a chamber pressure of a chamber housing the substrate during deposition of the second tungsten-containing film is less than 10 Torr and wherein the total fluorine concentration in the second tungsten-containing film is less than $10^{18}$ atoms/cm$^3$.

14. The method of claim 13, wherein the first tungsten-containing film is deposited on a barrier layer.

15. The method of claim 13, wherein the first tungsten-containing film is deposited on a silicon oxide.

16. The method of claim 13, wherein the chamber pressure is less than 7 Torr.

17. The method of claim 13, wherein the chamber pressure is less than 5 Torr.

18. The method of claim 13, wherein the first tungsten-containing film is at least about 90% atomic tungsten.

19. The method of claim 13, wherein the first tungsten-containing film is at least about 99% atomic tungsten.

20. A method comprising:
exposing a substrate to alternating pulses of a fluorine-containing tungsten precursor and a reducing agent to thereby deposit a tungsten-containing film having a thickness on the substrate, wherein a chamber pressure of a chamber housing the substrate during the fluorine-containing tungsten precursor pulses is less than 10 Torr, and wherein a fluorine concentration profile of the tungsten-containing film is characterized by having a first profile portion where the fluorine concentration is less than $10^{18}$ atoms/cm$^3$, wherein the first profile portion represents a majority of the thickness of the tungsten-containing film.

* * * * *